United States Patent
Schneider

(10) Patent No.: US 7,612,693 B2
(45) Date of Patent: *Nov. 3, 2009

(54) DIFFERENCE CODING ADAPTIVE CONTEXT MODEL

(75) Inventor: James P. Schneider, Raleigh, NC (US)

(73) Assignee: Red Hal, Inc., Raleigh, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/072,811

(22) Filed: Feb. 27, 2008

(65) Prior Publication Data

US 2009/0212982 A1    Aug. 27, 2009

(51) Int. Cl.
*H03M 7/34* (2006.01)

(52) U.S. Cl. .......................... 341/51; 341/50

(58) Field of Classification Search ............ 341/50, 341/51, 59, 65, 67, 106
See application file for complete search history.

(56) References Cited

U.S. PATENT DOCUMENTS

| | | | | |
|---|---|---|---|---|
| 4,906,991 A | * | 3/1990 | Fiala et al. | 341/51 |
| 5,796,356 A | * | 8/1998 | Okada et al. | 341/51 |
| 5,844,508 A | * | 12/1998 | Murashita et al. | 341/51 |
| 5,861,827 A | * | 1/1999 | Welch et al. | 341/51 |
| 7,274,671 B2 | * | 9/2007 | Hu | 370/256 |
| 7,348,899 B2 | * | 3/2008 | Kravtsounov et al. | 341/51 |

* cited by examiner

*Primary Examiner*—Peguy JeanPierre
(74) *Attorney, Agent, or Firm*—Blakely, Sokoloff, Taylor & Zafman LLP

(57) ABSTRACT

Techniques for improving encoding and decoding data are described herein. According to one embodiment, in response to a symbol retrieved from an input stream having a sequence of symbols, it is determined whether a current context can encode the retrieved symbol. A code representing an escape token is emitted to a code stream if the current context cannot encode the retrieved symbol. The process is escaped from the current context to a parent context of the current context if the current context is not a root context. The retrieved symbol is emitted to a literal stream if the current context is a root context, where the code stream and the literal stream are to be compressed and decoded by a decoder.

20 Claims, 38 Drawing Sheets

```
struct Context_Structure
{
    void    *Parent_Pointer;

void    *Child_Pointer[256];

| Context Table |
|---|
| <Esc> |
| | 
| |
| |
| |

Input Stream: | a | b | r | a | c | a | d | a | b | r | a |

Code Stream: | | | | | | | | | | | |

Literal Stream: | | | | | | | | | | | |

FIG. 9A

| Context Table |
|---|
| <Esc> |
| a |
| |
| |
| |

Input Stream: | a | b | r | a | c | a | d | a | b | r | a |

Code Stream: | 0 | | | | | | | | | | |

Literal Stream: | a | | | | | | | | | | |

FIG. 9B

| Context Table |
|---|
| <Esc> |
| a |
| b |
| |
| |

Input Stream: | a | b | r | a | c | a | d | a | b | r | a |

Code Stream: | 0 | 0 | | | | | | | | | |

Literal Stream: | a | b | | | | | | | | | |

FIG. 9C

| Context Table |
|---|
| <Esc> |
| a |
| b |
| r |
| |

Input Stream: | a | b | r | a | c | a | d | a | b | r | a |

Code Stream: | 0 | 0 | 0 | | | | | | | | |

Literal Stream: | a | b | r | | | | | | | | |

FIG. 9D

| Context Table |
|---|
| a |
| <Esc> |
| b |
| r |

Input Stream: | a | b | r | a | c | a | d | a | b | r | a |

Code Stream: | 0 | 0 | 0 | 1 | | | | | | | |

Literal Stream: | a | b | r | | | | | | | | |

FIG. 9E

| Context Table |
|---|
| <Esc> |
| a |
| b |
| r |
| c |

Input Stream: | a | b | r | a | c | a | d | a | b | r | a |

Code Stream: | 0 | 0 | 0 | 1 | 0 | | | | | | |

Literal Stream: | a | b | r | c | | | | | | | |

FIG. 9F

| Context Table |
|---|
| a |
| <Esc> |
| b |
| r |
| c |

Input Stream: | a | b | r | a | c | a | d | a | b | r | a |

Code Stream: | 0 | 0 | 0 | 1 | 0 | 0 | | | | | |

Literal Stream: | a | b | r | c | | | | | | | |

FIG. 9G

| Context Table |
|---|
| <Esc> |
| a |
| b |
| r |
| c |
| d |

Input Stream: | a | b | r | a | c | a | d | a | b | r | a |

Code Stream: | 0 | 0 | 0 | 1 | 0 | 0 | 0 | | | | |

Literal Stream: | a | b | r | c | d | | | | | | |

FIG. 9H

| Context Table |
|---|
| a |
| <Esc> |
| b |
| r |

Output Stream: a b r a
Code Stream: 1 0 0 0 0 3 1 1
Literal Stream: c d

FIG. 10E

| Context Table |
|---|
| <Esc> |
| a |
| b |
| r |
| c |

Output Stream: a b r a c
Code Stream: 0 0 0 0 3 1 1
Literal Stream: d

FIG. 10F

| Context Table |
|---|
| a |
| <Esc> |
| b |
| r |
| c |

Output Stream: a b r a c a
Code Stream: 0 0 0 3 1 1
Literal Stream:

FIG. 10G

| Context Table |
|---|
| a |
| <Esc> |
| b |
| r |
| c |
| d |

Output Stream: a b r a c a d
Code Stream: 0 0 3 1 1
Literal Stream:

FIG. 10H

| Context Table |
|---|
| a |
| <Esc> |
| b |
| r |
| c |
| d |

Output Stream: | a | b | r | a | c | a | d | a | | |

Code Stream: | 3 | 1 | 1 | | | | | | | |

Literal Stream: | | | | | | | | | | |

FIG. 10I

| Context Table |
|---|
| b |
| a |
| <Esc> |
| r |
| c |
| d |

Output Stream: | a | b | r | a | c | a | d | a | b | |

Code Stream: | 1 | 1 | | | | | | | | |

Literal Stream: | | | | | | | | | | |

FIG. 10J

| Context Table |
|---|
| r |
| b |
| a |
| <Esc> |
| c |
| d |

Output Stream: | a | b | r | a | c | a | d | a | b | r |

Code Stream: | 1 | | | | | | | | | |

Literal Stream: | | | | | | | | | | |

FIG. 10K

| Context Table |
|---|
| a |
| r |
| b |
| <Esc> |
| c |
| d |

Output Stream: | a | b | r | a | c | a | d | a | b | r | a |

Code Stream: | | | | | | | | | | |

Literal Stream: | | | | | | | | | | |

FIG. 10L

DIFFERENCE CODING ADAPTIVE CONTEXT MODEL

TECHNICAL FIELD

The present invention relates generally to data coding. More particularly, this invention relates to difference coding adaptive context model used in data coding.

BACKGROUND

Traditional entropy encoding coding algorithms (such as Huffman coding, adaptive Huffman coding or range coding) can normally be improved by preprocessing their input using a technique designed to enhance the statistical features used by the compression algorithm to achieve coding efficiencies. One example of such a technique is the Burrows-Wheeler transform ("BWT"), where large blocks of input are rearranged in a sorted order. While BWT does improve compression efficiency, it does not replace symbol values, so it may not be as efficient on input streams with a wide variance in symbols, or streams where a large number of the symbols have high values. Thus, a technique to transform these input streams so that they may be efficiently compressed is needed.

BRIEF DESCRIPTION OF THE DRAWINGS

The present invention is illustrated by way of example and not limitation in the figures of the accompanying drawings in which like references indicate similar elements.

FIGS. 3-4 are data structures which may be used for encoding and decoding processes according to one embodiment of the invention.

FIGS. 6A-6L are data diagrams illustrating an encoding process according to one embodiment of the invention.

FIGS. 7A-7L are data diagrams illustrating a decoding process according to one embodiment of the invention.

FIGS. 9A-9L are data diagrams illustrating an encoding process according to another embodiment of the invention.

FIGS. 10A-10L are data diagrams illustrating a decoding process according to another embodiment of the invention.

DETAILED DESCRIPTION

In the following description, numerous details are set forth to provide a more thorough explanation of the embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

Figure 1:
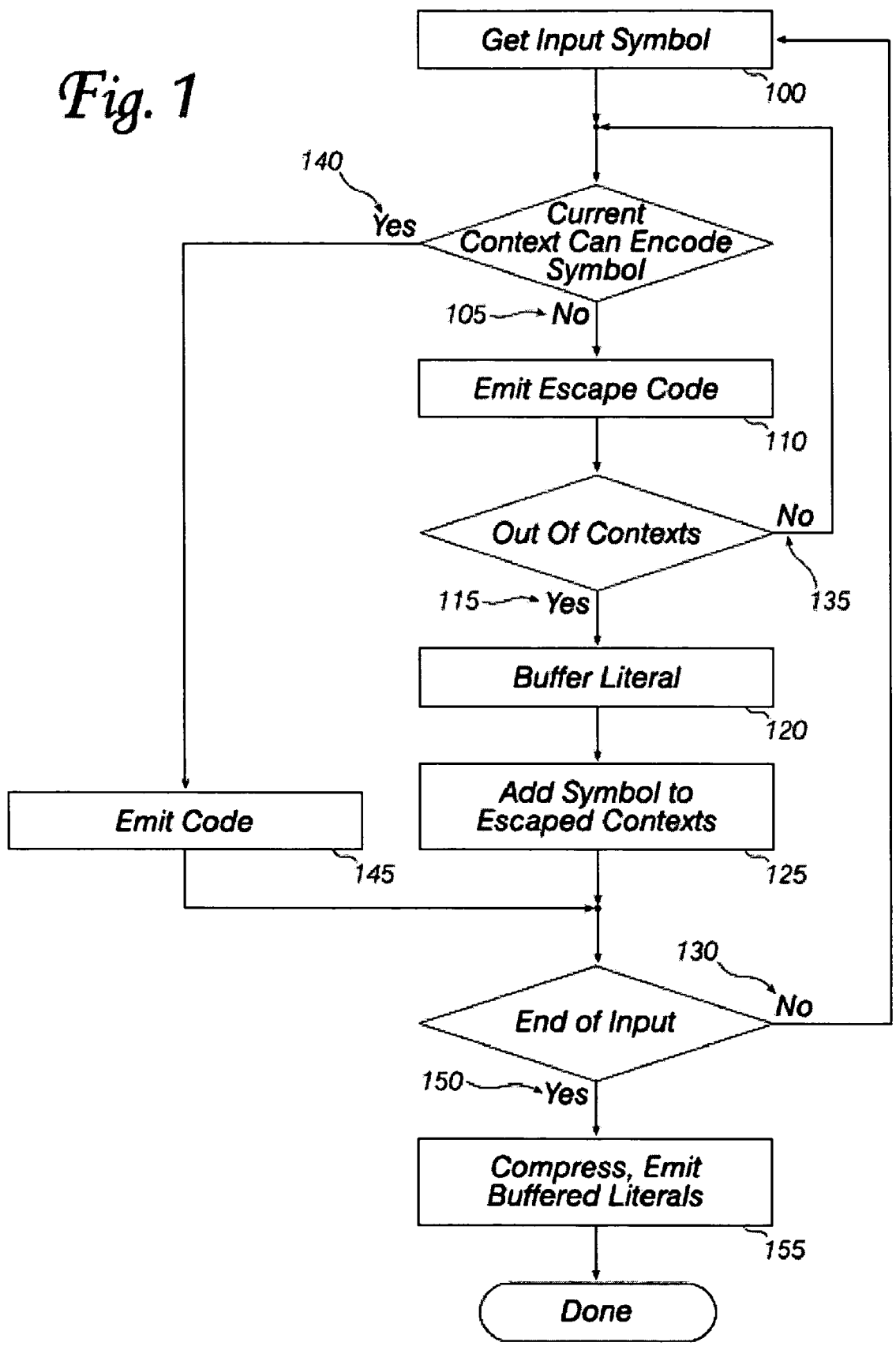
FIG. 1 shows an overview of an adaptive coding process according to an embodiment of the invention.
Figure 2:
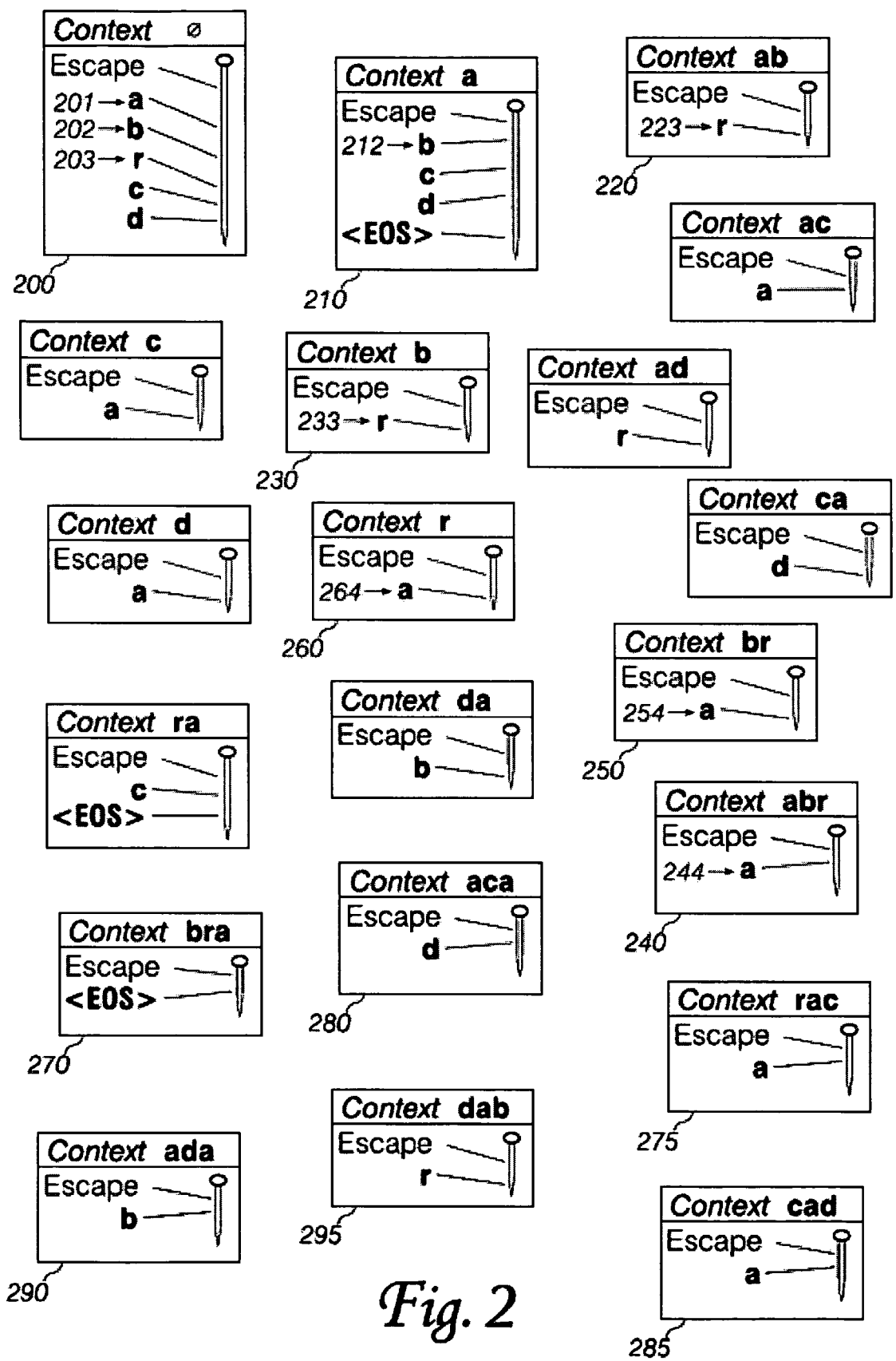
FIG. 2 shows the three-symbol contexts that are created as an embodiment of the invention compresses the string "abracadabra".

FIG. 1 is a flow diagram illustrating operations of an adaptive difference coder according to one embodiment of the invention. The following explanation will track the coder through the flow chart as it processes an input string, "abracadabra". Coding can be thought of as building a model of the input data and picking a minimal set of clues about the model to send to a decoder, so that the decoder can replicate the model and reproduce the input string. FIG. 2 shows "contexts" of the model according to certain embodiments of the invention. Each context corresponds to symbols the coder has recently encoded (or symbols the decoder has recently recovered). The coder examined in this example uses three-symbol contexts (i.e., each context corresponds to the up to three most-recently-encountered input symbols). Shorter contexts (two-character, one-character, and no-character contexts) also appear in the model, which may be a parent of a longer context (e.g., next order context) in a tree structure. All the contexts together make up a probability model that, in some sense, represents estimates of the likelihood that a particular symbol will be seen at a certain point in the input.

According to one embodiment, as an example of an implementation, each context may be defined as a data structure as shown in FIG. 3. Referring to FIG. 3, each context includes a parent pointer pointing to a parent context of the current context (e.g., a shorter context). The root context would have the parent pointer as NULL or zero since it does not have any parent. Each context may also include one or more child contexts (e.g., longer contexts or next order contexts), where number of the child contexts depends on a specific application or configuration. In this example, it is assumed that there are 256 different symbols plus an escape symbol. Note that the data structure as shown in FIG. 3 is described for purposes of illustration only. Other formats or configurations may also exist.

Although all of the contexts, and the symbols each can encode, are shown in FIG. 2, they accumulate over time (as described below). The model starts out empty, with the initial context 200 (e.g., context "" as a root context) able to encode only an escape symbol. The escape symbol is distinct from the 256 possible symbols that could be present in a stream of eight-bit characters.

The coder retrieves the first input symbol (block 100), a. The current context, 200, cannot (yet) encode a (block 105) so the coder emits an escape token (block 110) and moves to a shorter context. Since context 200 is the shortest (zero-character) context, the coder is out of contexts (block 115). It buffers the literal a (120) and adds a to each of the escaped contexts (block 125). (Element 201 indicates the a added to context 200.) The coder has not reached the end of its input (block 130), so it loops back to get the next input symbol (block 100).

Figure 4:
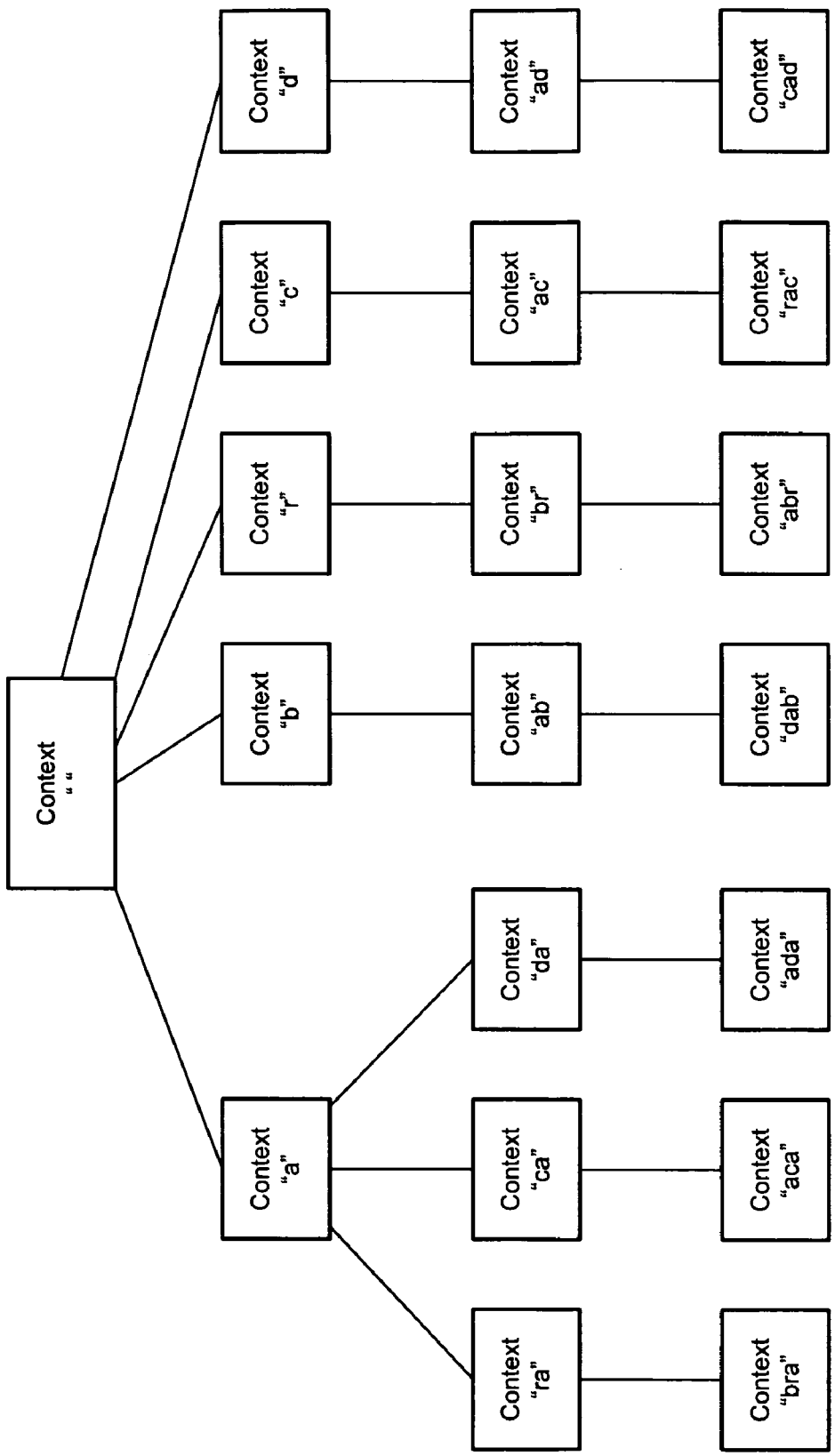

In practice, a child context is created having a parent pointer pointing to context 200 while context 200 has a child pointer pointing to the newly created child context, forming a tree structure similar to the one as shown in FIG. 4. In this example, context 210 (e.g., context "a") is created from context 200, where context "a" includes a parent pointer pointing to context 200 while context 200 includes a child pointer pointing to context "a", as shown in FIG. 4. At this point, context "a" can only encode an escape symbol, also referred to as "<Esc>" symbol, which may be considered implicit <Esc> symbol.

The next symbol is b, and the coder starts with the last context corresponding to the last symbol which is context "a" (block 210). Since context 210 cannot (yet) encode b (block 105), the coder emits an escape token (block 110) and moves (e.g., escapes) to a shorter context, which is context 200 (e.g., the parent context of context "a") as shown in FIG. 4. The next-shortest context is 200, so the coder is not out of contexts (block 135) and loops back to consider context 200. Context 200 is also unable to encode b (block 105) (it can currently encode only escape and a), so the coder emits another escape token (block 110) and moves to a shorter context. Again, context 200 is the shortest context, so the coder is out of contexts (block 115). The literal, b, is buffered and also added to each escaped context (blocks 202, 212). So far, the coder has emitted three escapes and buffered two literals. Only the escape from context 200 on input symbol b required any bits to encode; all the other escapes were from contexts that could only encode the escape.

The next symbol is r and the starting context is ab (block 220), which corresponds to the last context with respect to "r" (e.g., for sequence of "abr" the last context having up to three symbols is context "ab"). Context 220 cannot encode r (block 105), so the coder emits an escape token (block 110) and moves to shorter context b (block 230) (e.g., parent context of context "b" as shown in FIG. 4). Context 230 also cannot encode r (block 105), so the coder emits another escape token (block 110) and moves to shorter context 200. Context 200 cannot encode r (block 105), so the coder emits another escape token (block 110) but is out of contexts (block 115), which in turns creates a child context "r", etc. Literal r is buffered and added to contexts 200, 220 and 230 (see 203, 223 and 233). The end of the input has still not been reached (block 130), so the coder loops back yet again.

For the next input symbol, a, the coder starts at context 240 and escapes through 240, 250 and 260 (adding coding 244, 254 and 264) before discovering that context 200 can encode the input symbol (block 140). Therefore, the coder emits the appropriate code (block 145) and loops back again.

The following table summarizes the activity of the coder working through the input string. "<EOS>" signifies the end of the string. "Escapes" is the number of contexts escaped from before a context that can encode the current symbol is found, or a literal must be buffered. "Coding Context" identifies the context that was able to encode a symbol, while "Literal" indicates that the coder buffered a literal and updated one or more escaped-from contexts.

TABLE 1

| Symbol | Start Context | Escapes | Coding Context | Literal |
|---|---|---|---|---|
| a | 200 Ø | 1 | | a |
| b | 210 a | 2 | | b |
| r | 220 ab | 3 | | r |
| a | 240 abr | 3 | 200 | |
| c | 270 bra | 4 | | c |
| a | 275 rac | 3 | 200 | |
| d | 280 aca | 4 | | d |
| a | 285 cad | 3 | 200 | |
| b | 290 ada | 3 | 200 | |
| r | 295 dab | 3 | 200 | |
| a | 240 abr | | 240 | |
| <EOS> | 270 bra | 4 | | <EOS> |

After escaping from context 270 and buffering the end-of-stream (EOS) literal, the coder determines that the end of input has been reached (block 150). Now, it compresses the buffered literals and emits them in a discernible position relative to the encoded data bits (for example, at the beginning of the encoded stream, at the end of the stream, or at a block boundary in the stream). Concerns affecting the placement of the buffered, compressed literals are discussed below.

Figure 5:
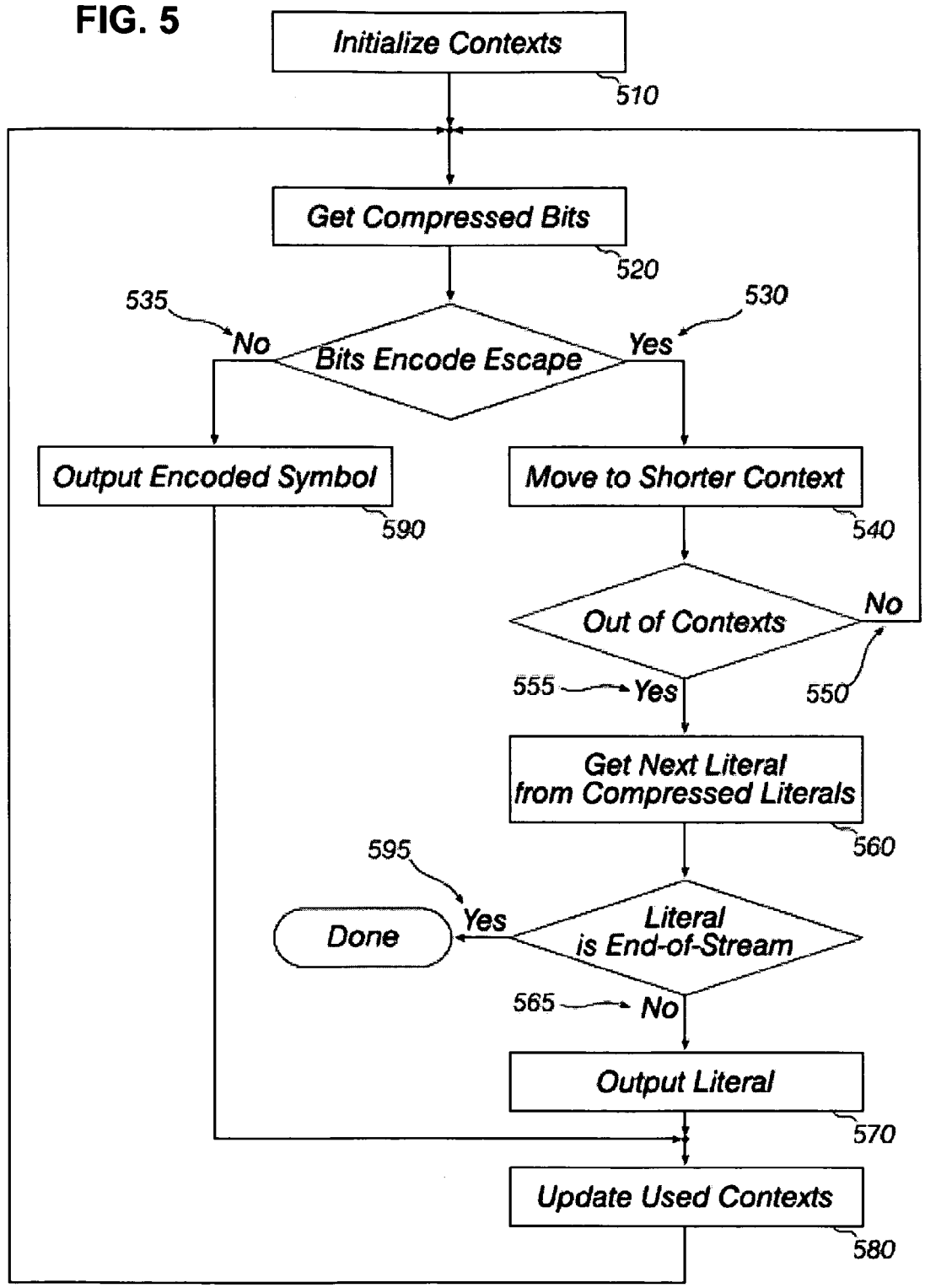
FIG. 5 is a flow diagram outlining decoding according to an embodiment of the invention.

FIG. 5 is a flow diagram outlining the operations of an adaptive data decoder according to an embodiment of the invention. Referring to FIG. 5, the decoder initializes its context model identically to the coder's initialized model (block 510). Recall that despite the large number of contexts (shown in FIG. 2) that exist after compressing an input stream, the coder and decoder start with just one context, 200, that can encode just one symbol, escape.

Next, the decoder gets some compressed bits from the compressed data stream. The number of compressed bits necessary to decide what to do next varies from time to time, depending on the state of the decoding context. For example, when decoding has just started and context 200 can only encode escape, no bits are required—the decoder knows that the coder must have emitted an escape, because that is the only thing it could emit. Consequently, the escape is encoded in zero bits.

Since the first compressed bits encode escape (block 530), the decoder moves to a shorter context (block 540). However, since context 200 is already the shortest context, the decoder is out of contexts (block 555) and requires a literal. It obtains the next literal from the literal decoder (block 560), checks to ensure that it has not reached the end-of-stream (block 565) and outputs the literal as the reconstituted data (block 570). Referring to Table 1, it is clear that the first compressed literal was a, so that symbol is output.

Any contexts used (e.g., escaped from) are updated (block 580), and the decoder loops back to get more compressed bits (block 520). (Again, no compressed bits have been used yet, because no existing context could encode anything except Escape.)

Now, the decoder is in context 210, because it has just produced the symbol a. Context 210 is unable to encode any symbol except escape, so the decoder again consumes zero bits to determine that the next encoded symbol is escape (block 530). Now, the decoder moves to the next-shorter context (block 540), which is context 200. It is not out of contexts (block 550), so it loops back to get more compressed bits (block 520).

Context 200 currently encodes escape and a, so some information (at least a portion of a compressed bit) is required to decide which. This compressed bit encodes another escape (block 530). This is the third escape mentioned above. The decoder moves to a shorter context (block 540) and runs out of contexts (555), so it gets the next literal from the compressed literals (block 560), notes that it is not end-of-stream (block 565), and outputs it (block 570). Recall that the second literal produced during coding was b. The contexts escaped from (210, 200) are updated (block 580) and the decoder loops back again.

This process continues until the characters abr have been recovered and output. The decoder is in state 240 and gets some more compressed bits (block 520). States 240, 250 and 260 only encode escapes, so no bits are consumed as the decoder escapes to shorter contexts. When it reaches context 240, it discovers that the next compressed bits encode a (block 535), so it outputs this symbol (block 590), updates the appropriate contexts (580) and loops back to process more compressed bits.

The decoder continues working through the compressed bits, extracting literals as necessary from the compressed literals block, until there are no more compressed bits to examine. At this point, the original input symbol sequence has been reconstituted and emitted.

Note that the decoding process requires literals from the compressed block fairly early in its operations (in fact, the very first thing it does is infer an escape from zero compressed bits, extract a compressed literal and output it). Thus, it is important for the decoder to have access to the compressed literals as soon as possible. If the decoder has access to the entire compressed data stream, then it can use the dual-file-pointer method depicted to access the literals as necessary. However, if the decoder is receiving the compressed data stream from a non-seekable source, it must buffer the data until it can determine where the compressed literals are. Further detailed information regarding the techniques set forth above can be found in a co-pending U.S. patent application Ser. No. 11/948,954, filed Nov. 30, 2007, which is incorporated by reference herein.

According to certain embodiments of the invention, the above data coding techniques may be further improved by optimizing context tables, such as, for example, by moving the latest occurred symbol entry up front in the table or moving highest frequently occurred symbol up front in the table, and using the index corresponding symbols to be coded in a code stream in order to further optimize encoding and decoding processes while maintaining the size of the data stream as minimum.

FIGS. 6A-6L are block diagrams illustrating an encoding process according to one embodiment of the invention. Referring to FIGS. 3-4, 6A-6L, and 8A, it is assumed that, as an example, an input stream of "abracadabra" is to be encoded into a code stream and a literal stream, which may be compressed using a variety of coders. Note that process as shown in FIGS. 6A-6L and 8A may be performed by an encoder which may include software, hardware, or a combination of both.

Figure 6A:
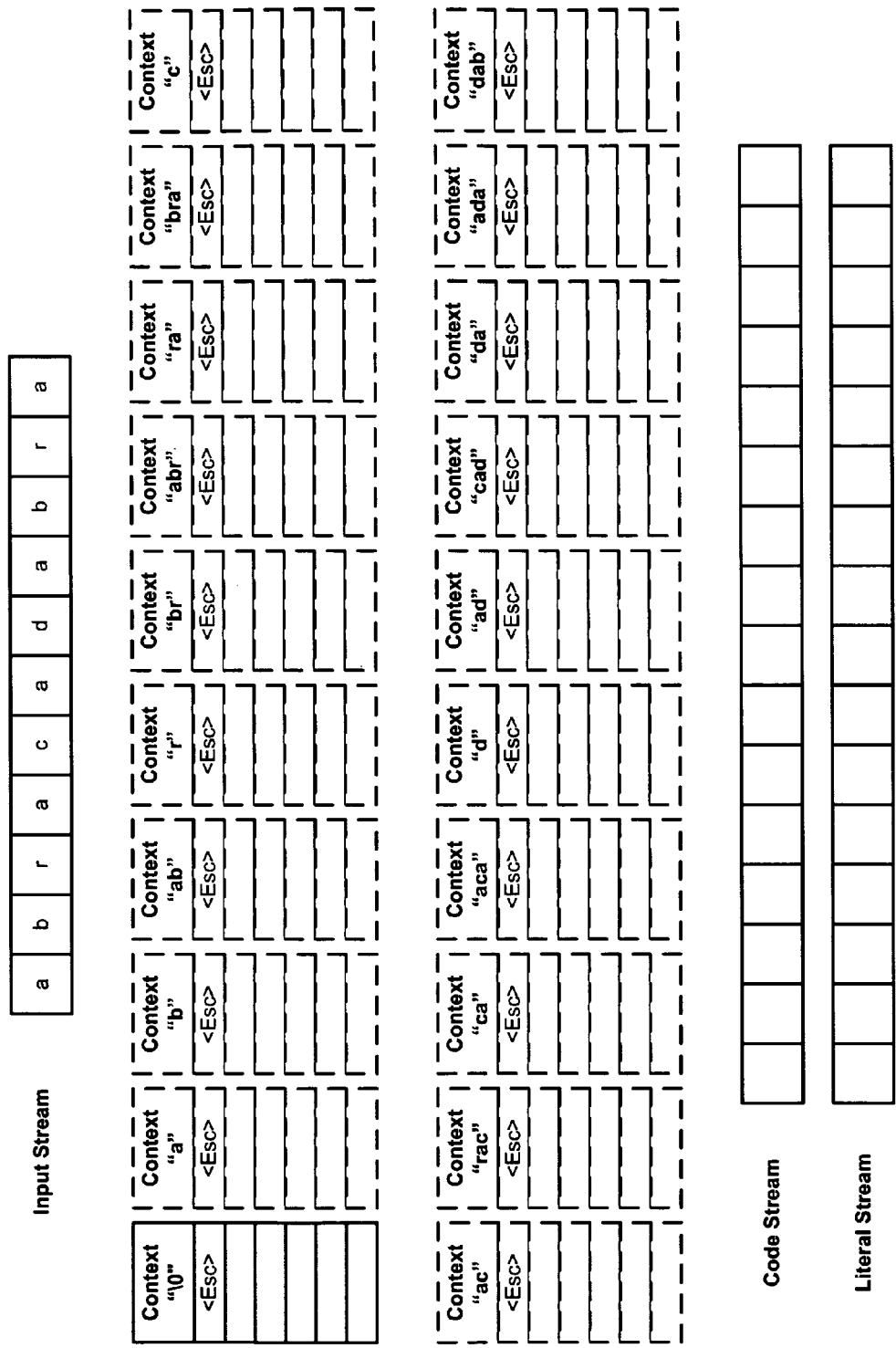

The process starts with the order-0 context (e.g., context "\0" or context ""), which just has the escape code in its table indicated with solid lines or boxes, while other context tables that do not exist yet are indicated by dash lines or boxes, as shown in FIG. 6A.

When the coder sees the first "a" (block 802), the only thing that can be coded is an escape (block 806). Since it is the only thing the encoder (also simply referred to as a coder) can code, the coder does not actually have to generate the code for it (block 806). We do need to buffer the literal "a" though since this is a root context (blocks 814 and 818). At block 812, the context tables are updated. In this example, "a" is added to the root context and child context for "a" is created with a parent point pointing to the root context "" while the root context "" has a child pointer pointing to context "a".

Figure 6B:
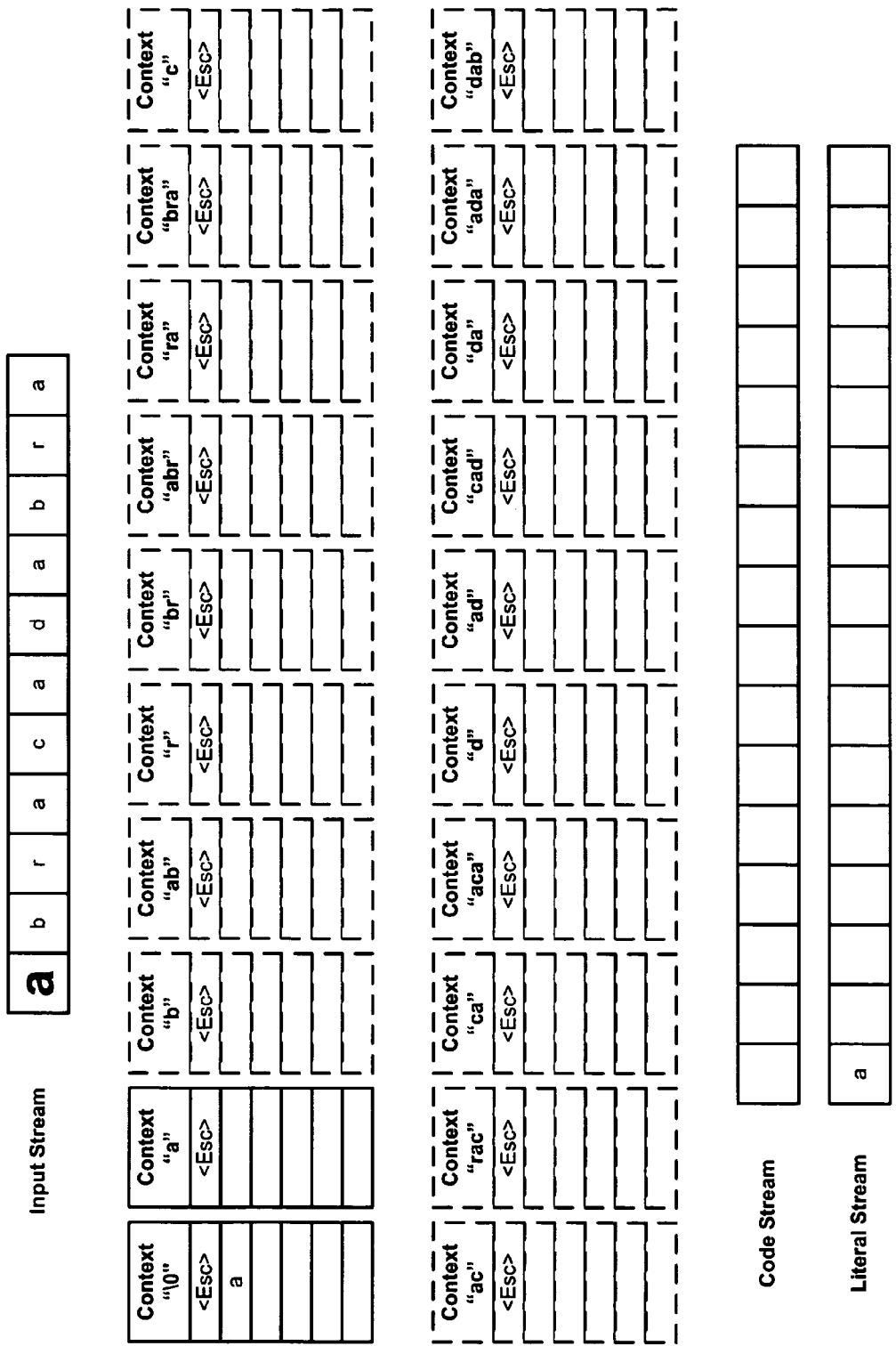

Since in this example, multiple context tables are utilized, the order-0 context data structure would also contain pointers to successor contexts (only the "a" context, in this case) as shown in FIGS. 3-4. For purposes of illustration, pointers to parent and child are omitted herein. Just keep in mind that every order 0, 1, and 2 context table (in this example—add more contexts if you go beyond order 3) has a corresponding pointer to the next deeper context for each item in its available codes table. Also, each order 2 and 3 context table has a pointer to a preceding context. In addition to the order-0 context, we also have one order-1 context that gets created as shown in FIG. 6B.

Figure 6C:
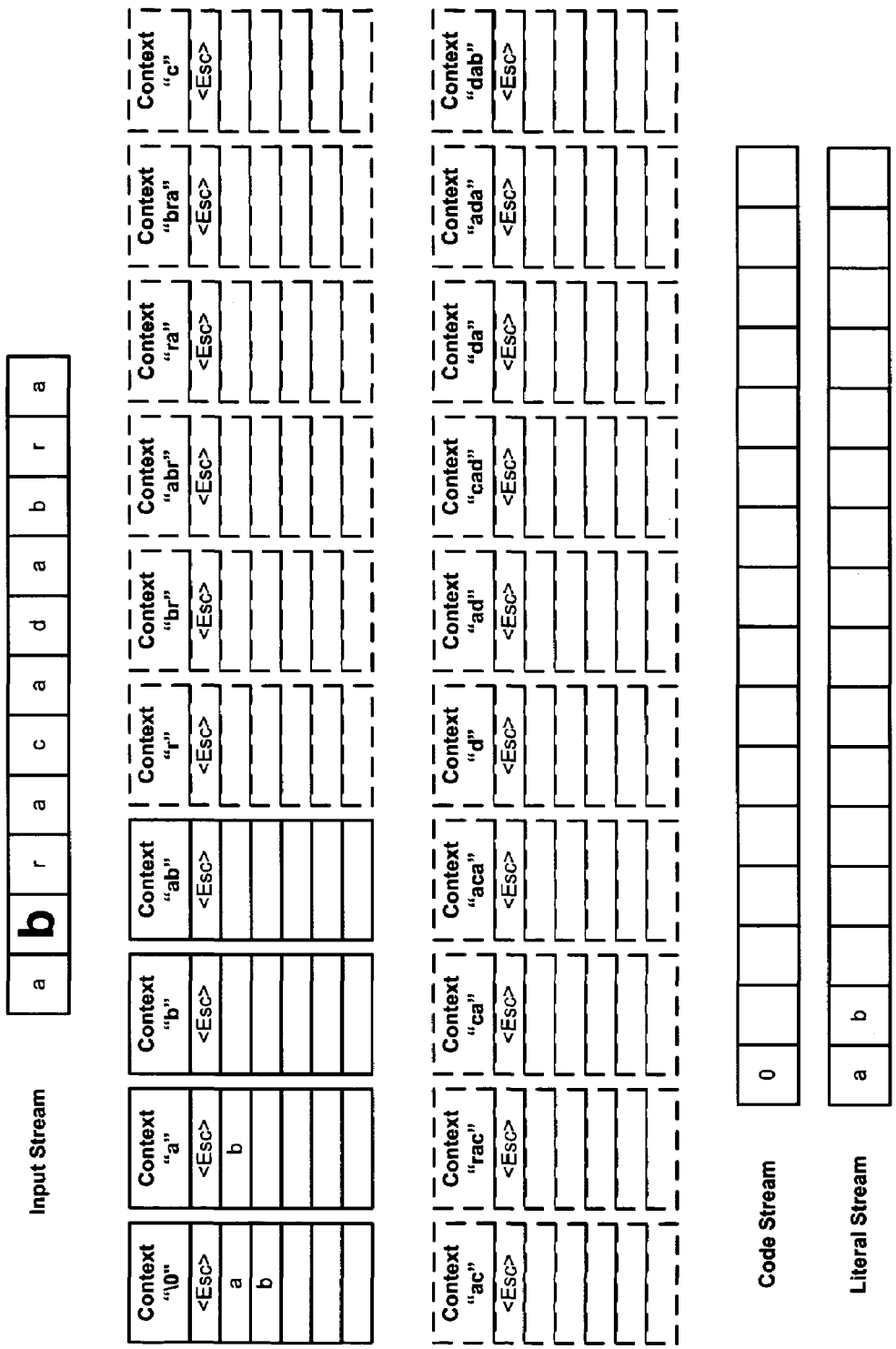

We are now in the "a" context (e.g., the context corresponding to the last symbol, in this example, the last symbol in the sequence with respect to "b" is "a"), and we see the "b" character here (e.g., "a*b*racadabra") at block 802. The "a" context can only code an escape (so that's implied), which takes us to (e.g., escape) the "" context (blocks 814 and 816), which generates an escape (using the index of zero) and buffers the literal "b", because context "" can code something other than an escape but cannot code "b" (blocks 806, 808, 820, 814, and 818). The literals stream now contains the characters "a" and "b", and the code stream contains a single 0 value (e.g., the index of the one escape that was explicitly generated: the escape from the "a" context and the first escape in the "" context were both implied—another way of looking at is the receiver will know at the beginning of the stream that only an escape can be generated, so it will supply one itself, and then add the first literal to the model, and then—from the context of the literal it just added—supply the next implicit escape), as shown in FIG. 6C. Up to this point, context tables for "b" and "ab" have been created with certain relations with other contexts as shown in FIG. 4, but only can encode the implicit escape code.

Figure 6D:
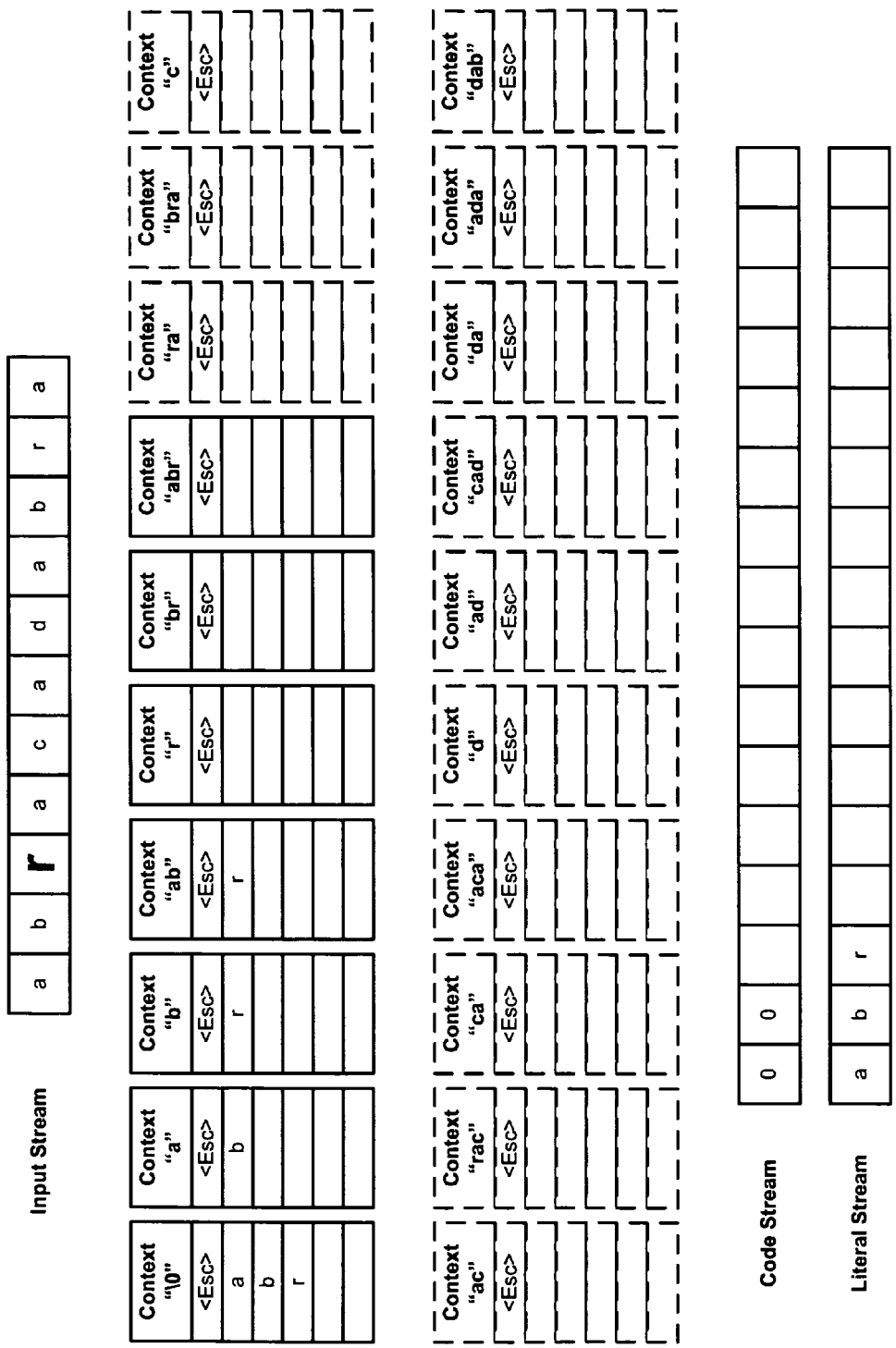

We are now in the "ab" context, and looking at the "r" character here (e.g., "ab*r*acadabra"). The "ab" and "b" contexts can only generate escapes (so they're implied). The "" context also generates an escape, and adds the "r" to the end of the literals buffer. The code stream is now 0-0, and the literals stream is now "abr", as shown in FIG. 6D. In addition, context tables for "r", "br", and "abr" have been created with certain relations with other contexts as shown in FIG. 4, but can only encode the implicit escape code.

Figure 6E:
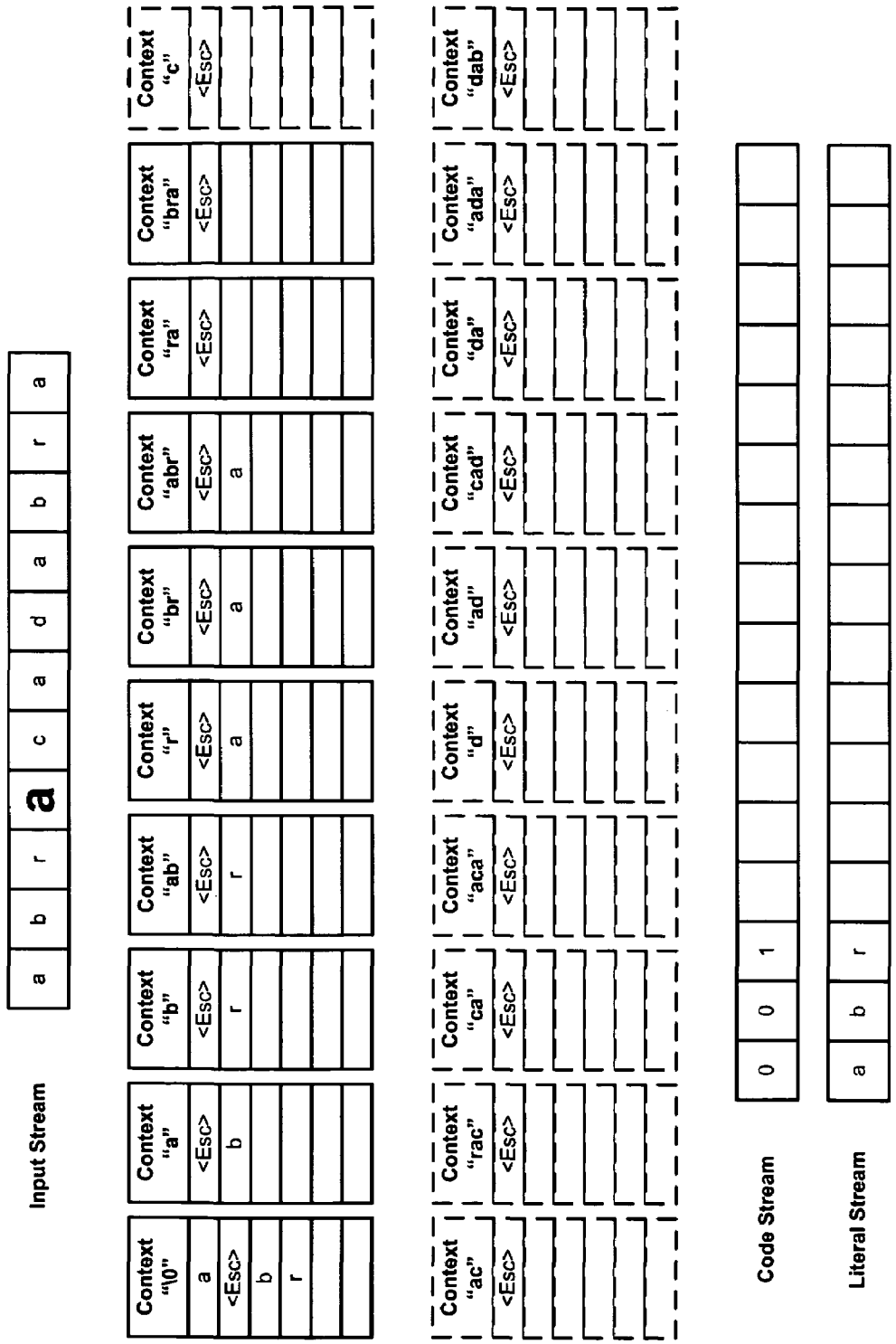

We are now in the "abr" context, and the next character is this "a" (e.g., "abr*a*cadabra") at block 802. None of "abr", "br", or "r" can generate anything but an escape, so those are implicitly generated (blocks 806, 814, and 816). The "" context, however, can generate an "a" (blocks 806 and 808), so the index for "a" (1) is coded as 1 and added to the code stream (block 810), and the tables are updated (block 812). The code (e.g., 1) being added to the code stream is determined by XORing the current index (e.g., index 1 corresponding to "a") with the last index (e.g., index 0 of the escape code). The code stream is now 0,0,1, and the literals stream is still "abr". In addition, the "bra" and "ra" contexts are created. Furthermore, context "" is sorted by moving "a" entry up front (now the escape entry is a second entry) as shown in FIG. 6E.

Figure 6F:
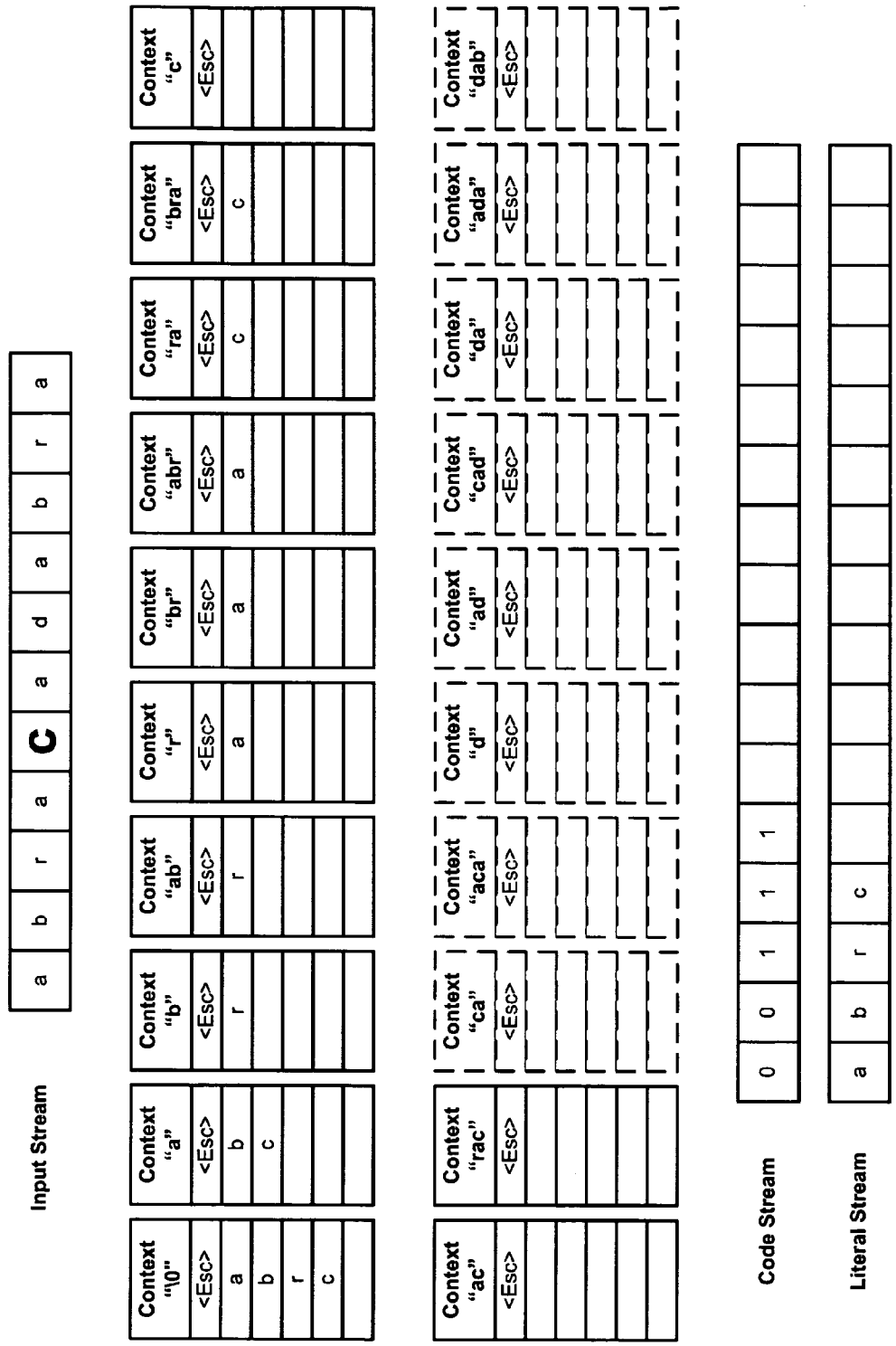

We are now in the "bra" context, about to code this "c" (e.g., "abra*c*adabra"). Neither "bra" nor "ra" context can code anything but an escape, so that is implicit. The "a" context cannot code a "c", so it issues an escape (index 0, code 1). The "" context cannot code the "c" either, so it issues an escape (index 1, code 1), and the coder adds a "c" to the literals stream. The code stream is now 0,0,1,1,1, and the literals stream is now "abrc", as shown in FIG. 6F.

Figure 6G:
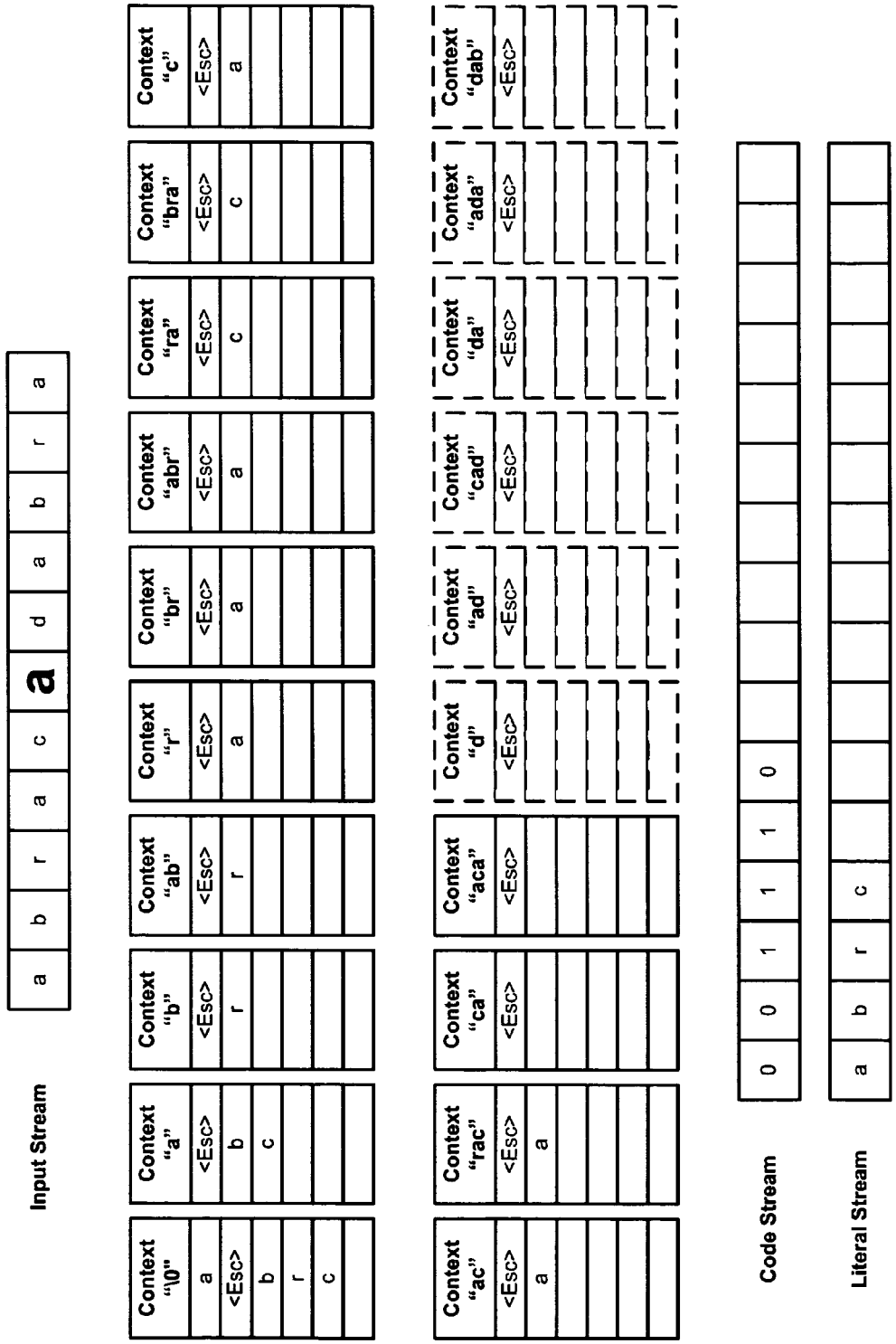

We are now in the "rac" context, about to code this "a" (e.g., "abrac*a*dabra"). None of "rac", "ac" or "c" context can do anything but generate an escape, so we wind up at the "" context, generating only implied escapes. The "" context can generate the "a"—it's index 1, code 0. The code stream is now 0, 0, 1, 1, 1, 0. The literals stream is still "abrc". In addition, context table "" is sorted (now "a" has been moved up front having index of 0) as shown in FIG. 6G.

Figure 6H:
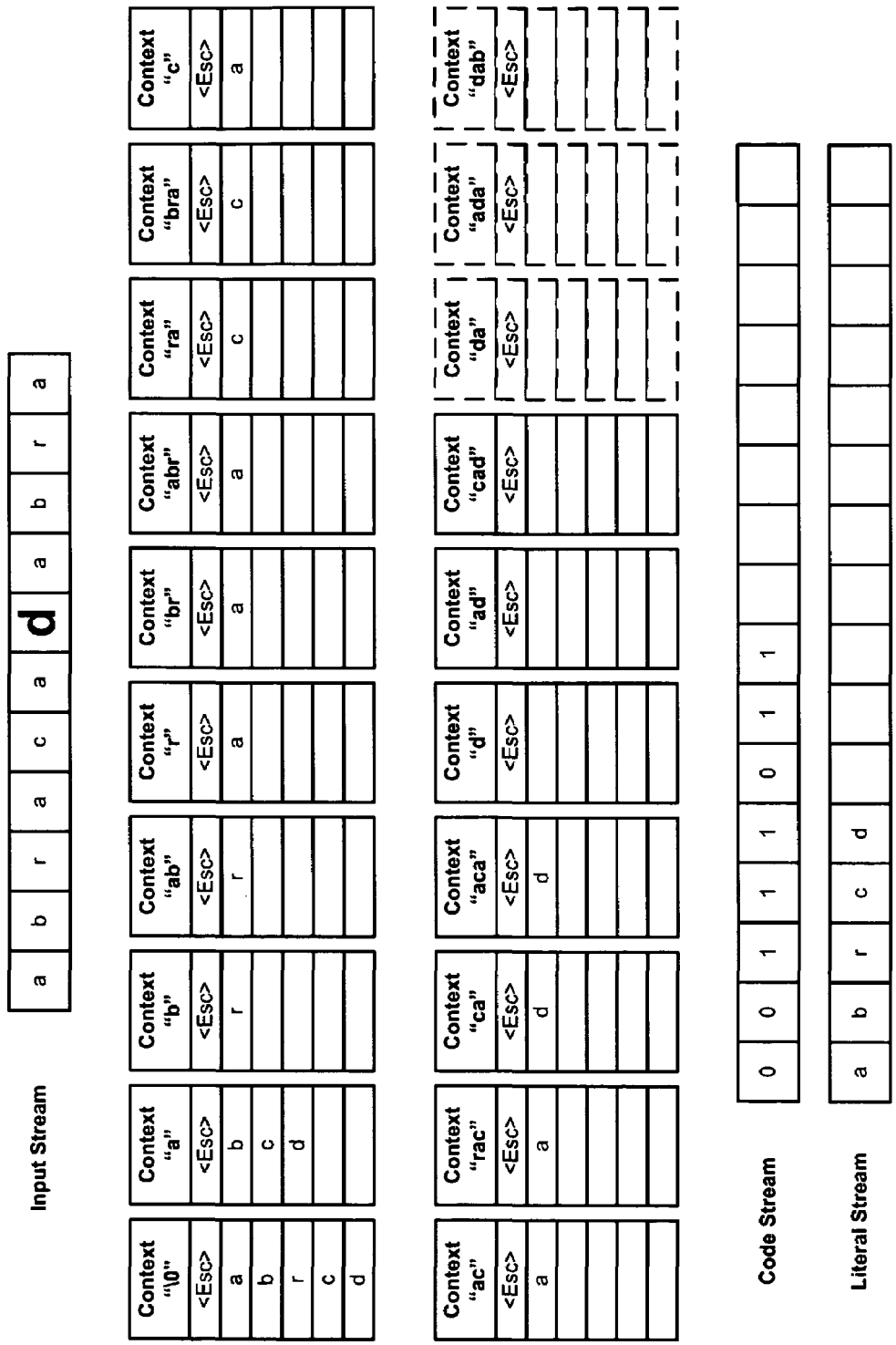
Figure 61:
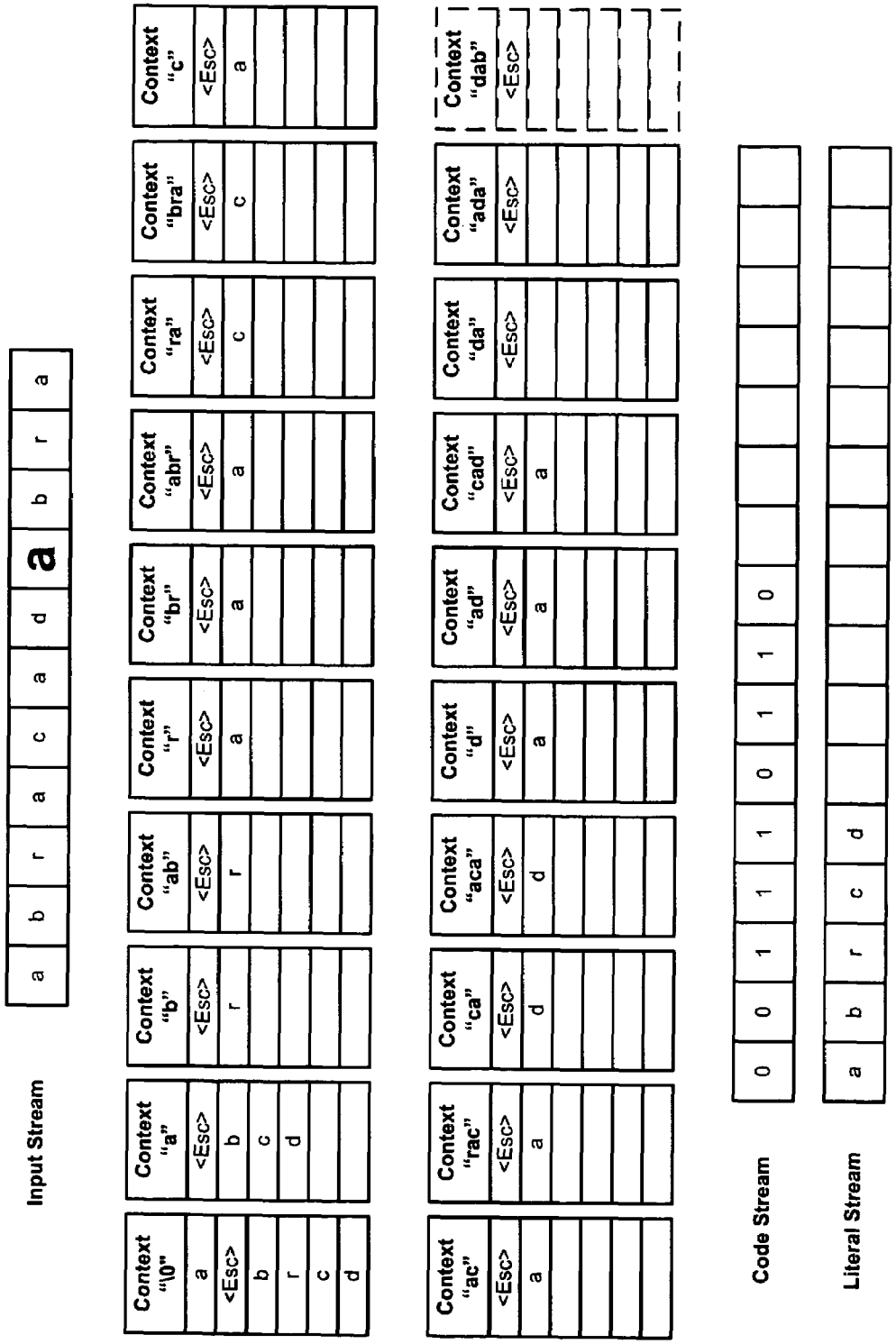

We are in the "aca" context, attempting to code this "d" (e.g., "abraca*d*abra"). Both "aca" and "ca" implicitly escape. The "a" context cannot code the "d" either, so it codes an escape (index 0, code 1). The "" context also generates an escape (index 1, code 1). The code stream is now 0, 0, 1, 1, 1, 0, 1, 1. The literals stream is now "abrcd" as shown in FIG. 6H.

We are now in the "cad" context, attempting to code this "a" (e.g., "abracad*a*bra"). "cad", "ad", and "d" all implicitly escape to the "" context, which codes the "a" as 0 (index 1, code 0). The code stream is now 0, 0, 1, 1, 1, 0, 1, 1, 0. The literals stream is now "abrcd". Furthermore, since "a" was at index 1, the table for context "" is sorted so that "a" now is moved up front as shown in FIG. 6I.

Figure 6J:
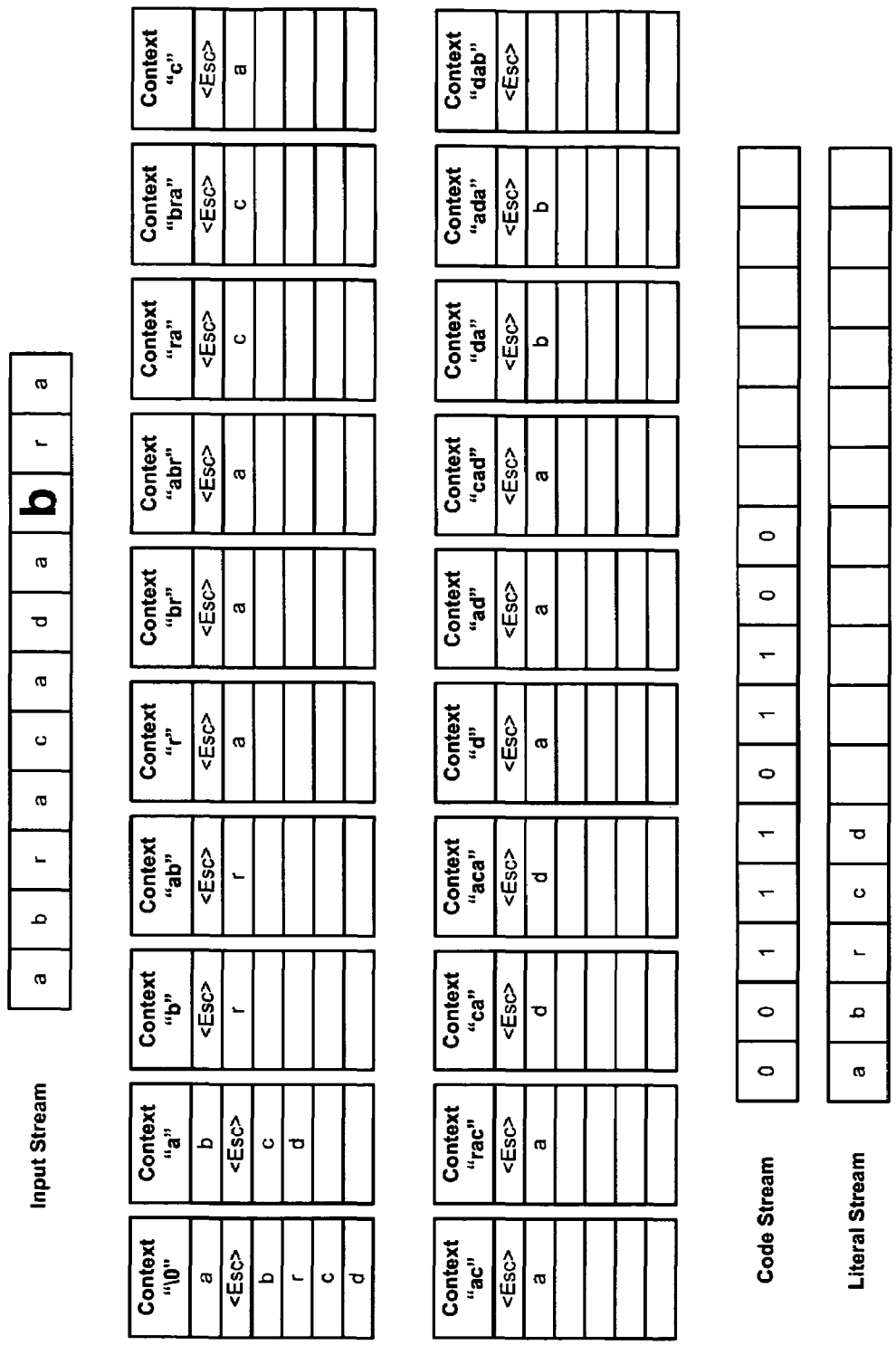

We are now in context "ada", attempting to code the "b" here (e.g., "abracada*b*ra"). The "ada" and "da" contexts implicitly escape back to the "a" context, which can code the "b" (index 1, code 0). Code stream is now 0, 0, 1, 1, 1, 0, 1, 1, 0, 0. The literals stream is still "abrcd". In addition, since "b" in context "a" was at index 1, "b" is now moved up front having an index of 0 in context "a" table as shown in FIG. 6J.

Figure 6K:
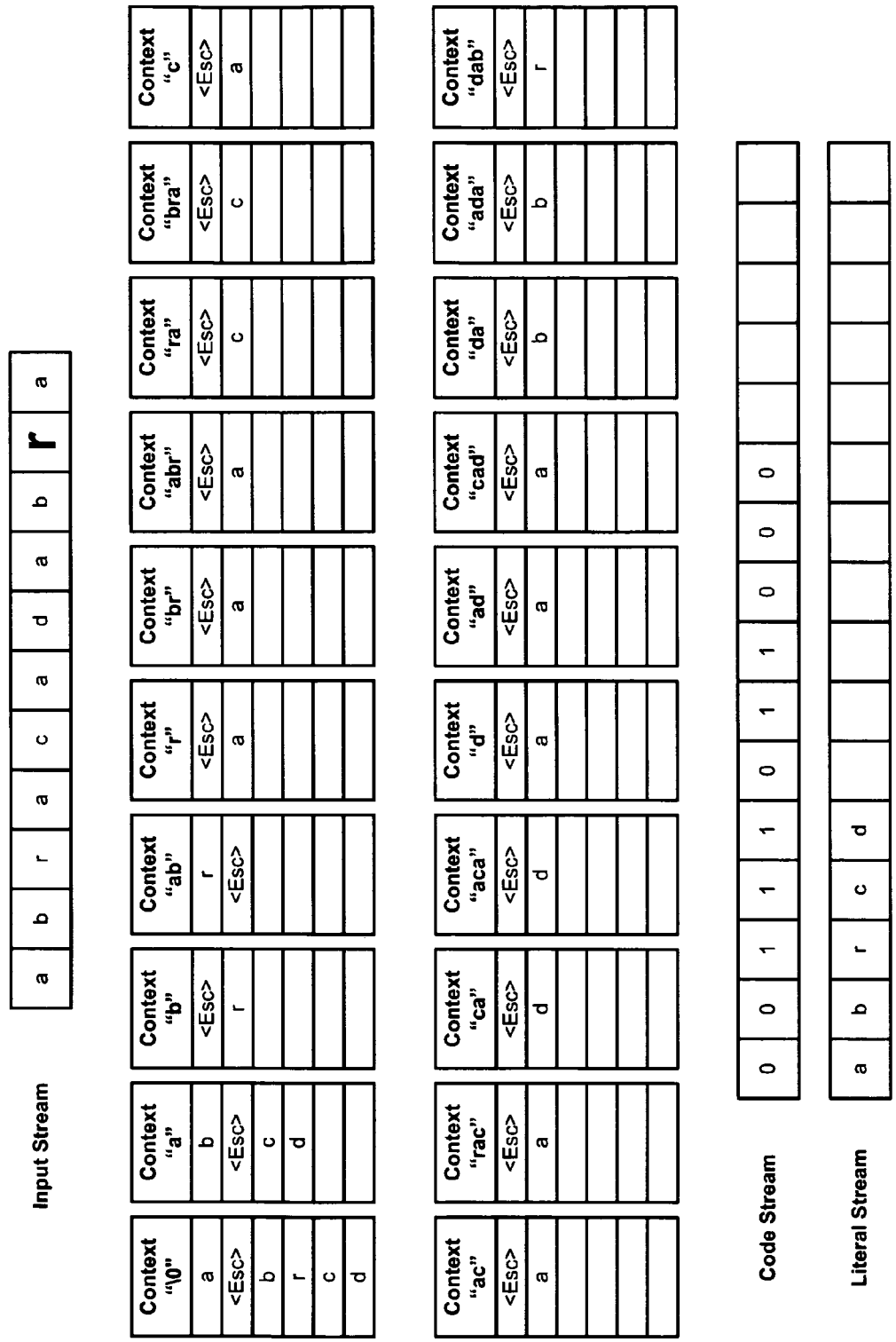

We are now in context "dab", attempting to code the "r" here (e.g., "abracadab*r*a"). The "dab" context implicitly escapes back to the "ab" context, which can code the "r" (index 1, code 0). Code stream is now 0, 0, 1, 1, 1, 0, 1, 1, 0, 0, 0. The literals stream is still "abrcd". In addition, "r" has been moved up front having an index of 0 in context "ab" table as shown in FIG. 6K.

Figure 6L:
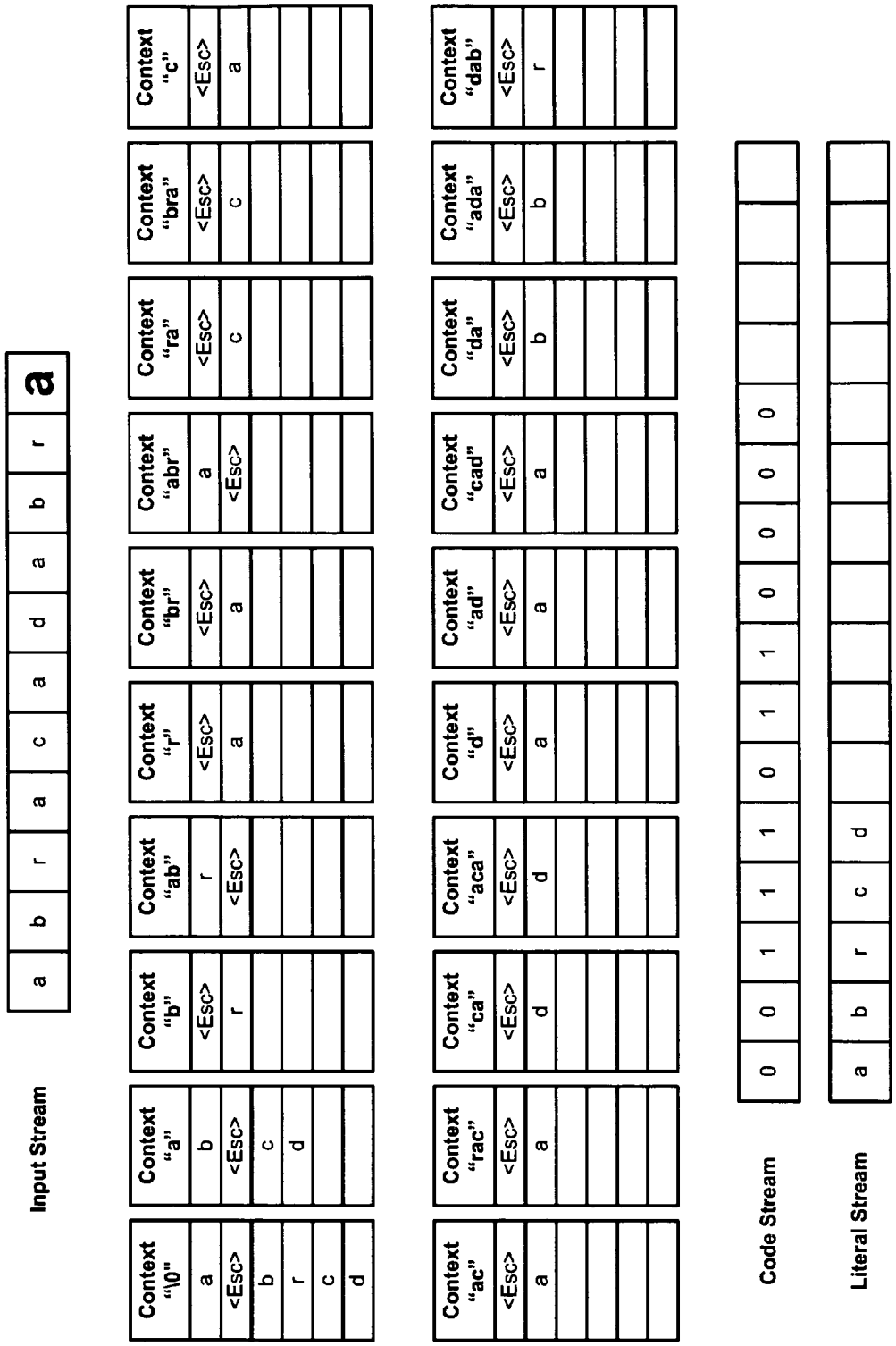

We are now in context "abr", attempting to code the last "a" (e.g., "abracadabr*a*"). This context can code the "a" (index 1, code 0). Code stream is now 0, 0, 1, 1, 1, 0, 1, 1, 0, 0, 0, 0. The literals stream is still "abrcd". In addition, "a" of context table "abr" has been moved up front having index of 0 as shown in FIG. 6L.

Now all symbols from the input stream have been coded and at the end an EOS (end of stream) is reached at block 804. The code stream and literals stream would then be handed off to second stage coder/coders (block 822). For example, the code stream (0, 0, 1, 1, 1, 0, 1, 1, 0, 0, 0, 0) could be coded using an adaptive Huffman coder in 28 bits, and the literals stream (abrcd) would take another 40 bits. In this example, that is 68 bits output for 88 bits input.

FIGS. 7A-7L are block diagrams illustrating a decoding process according to one embodiment of the invention. Referring to FIGS. 3-4, 7A-7L and 8B, it is assumed that, as an example, the code stream and literals stream generated from an encoder described above are to be decoded to recover data stream of "abracadabra", which may be decompressed using a variety of decoders. Note that process as shown in FIGS. 7A-7L may be performed by a decoder which may include software, hardware, or a combination of both.

Figure 7A:
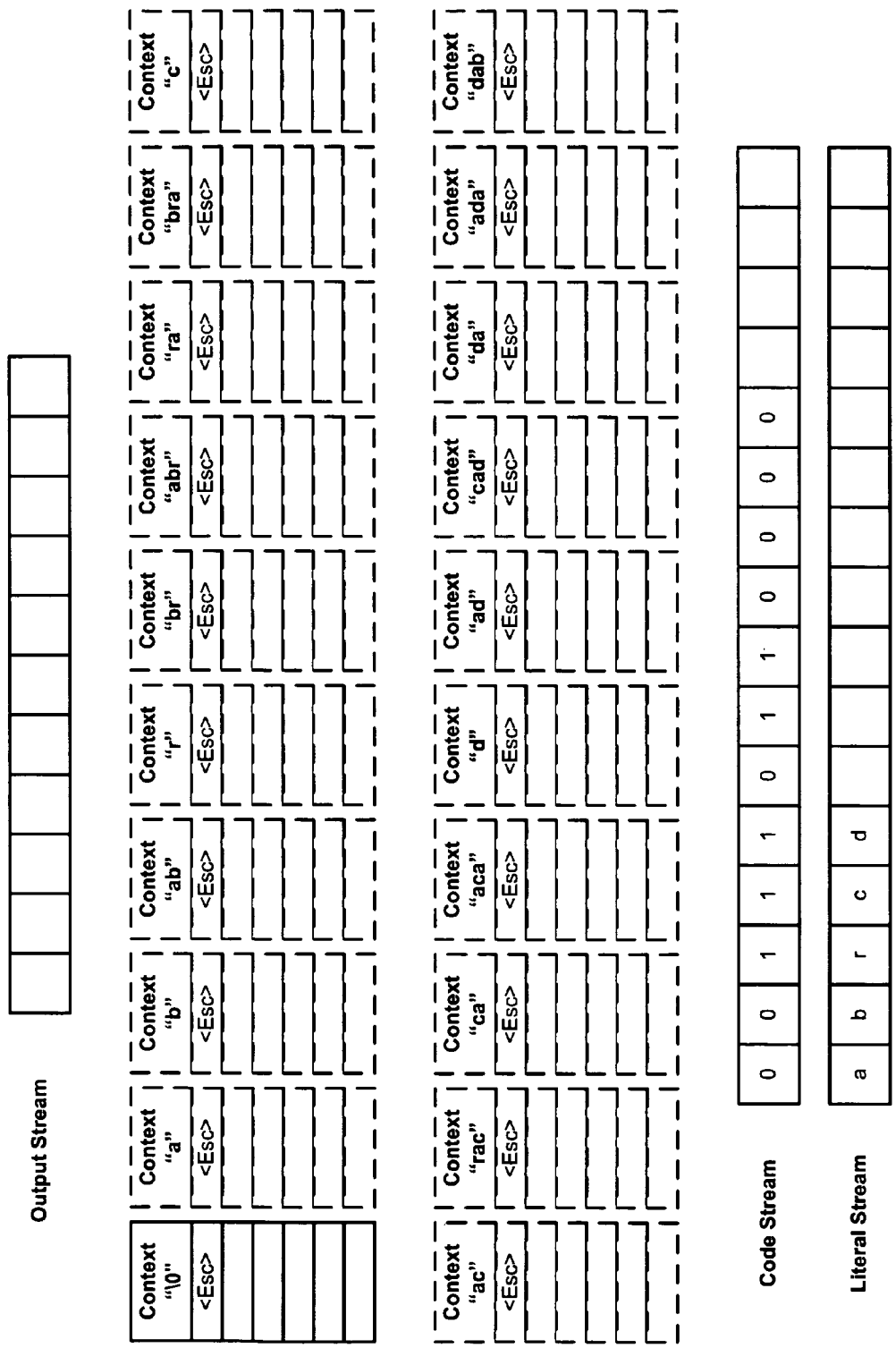
Figure 7B:
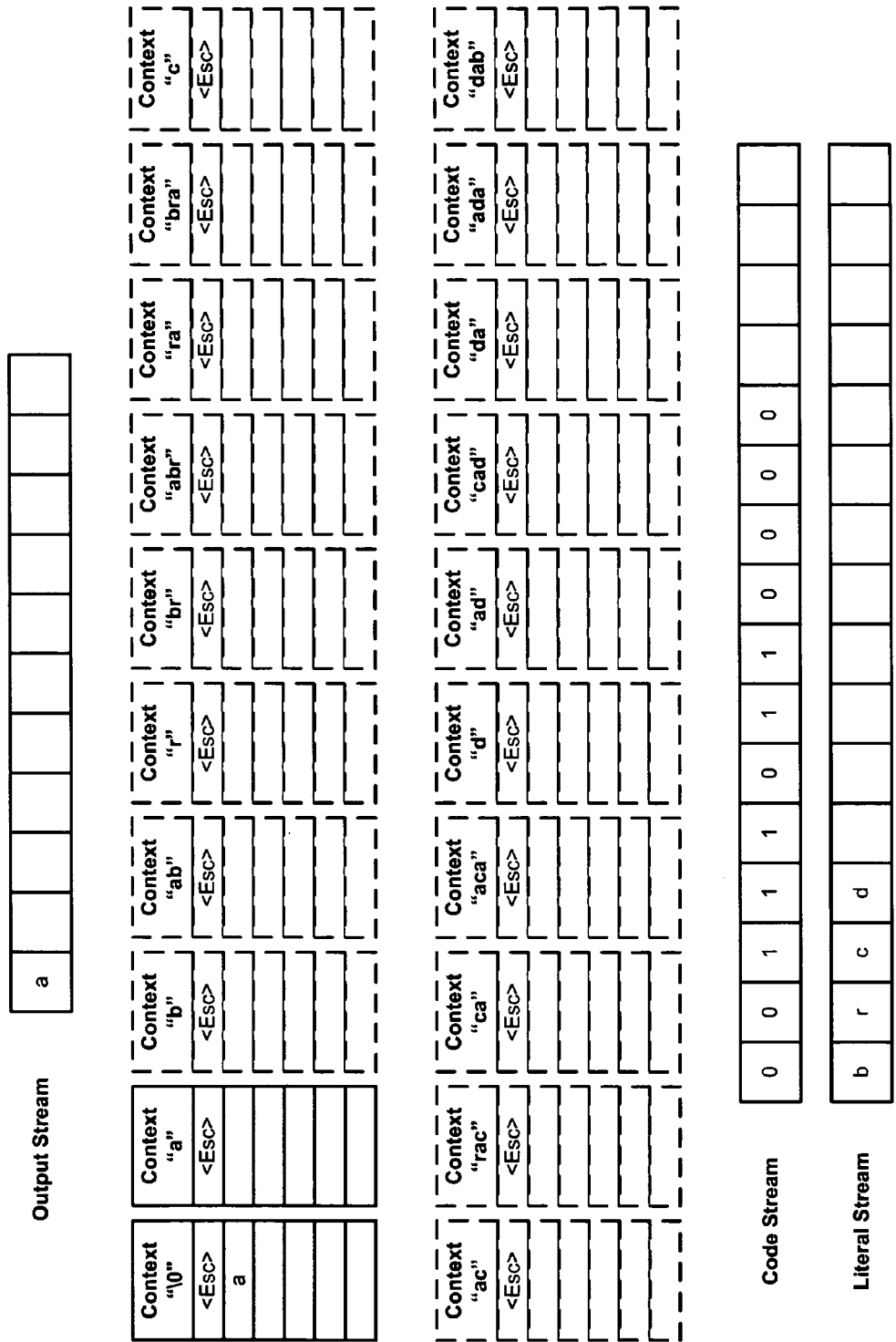

To decode, the decoder would begin with an empty "" context table as shown in FIG. 7A, the code stream (0, 0, 1, 1, 1, 0, 1, 1, 0, 0, 0, 0), and the literals stream (abrcd) (block 852). The decoder starts in the "" context, which can only code an escape (block 854). This means the escape is implicit, so the decoder consumes no codes at this operation. Since the escape was from the "" context (block 866), the decoder needs a literal, which it pulls (e.g., consume) from the front of the literals stream (and puts in the output stream) (blocks 868 and 870). In addition, the tables are updated, including adding literal in the existing tables and creating child tables, at block 874. The output stream is now "a", the unconsumed code stream is 0, 0, 1, 1, 1, 0, 1, 1, 0, 0, 0, 0 and the unconsumed literals stream is "brcd" as shown in FIG. 7B.

Figure 7C:
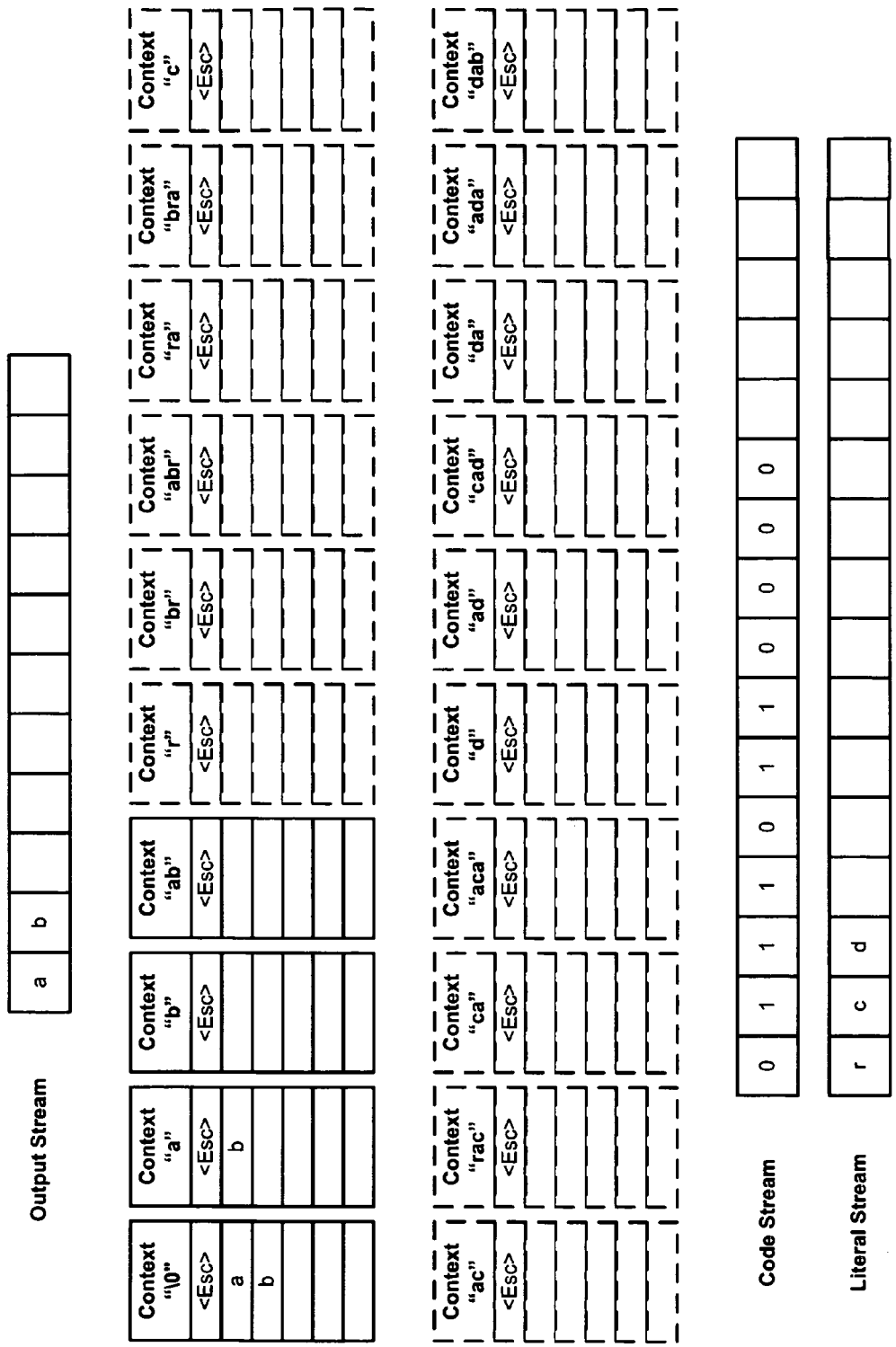

The decoder is now in the "a" context. Since the "a" context can only code an escape (block 854), the decoder assumes an escape (consuming no codes from the code stream) and consults the "" context (blocks 866 and 872). The "" context can code something other than the escape (block 854), so a code is consumed from the code stream—the current code is 0, leaving 0, 1, 1, 1, 0, 1, 1, 0, 0, 0, 0 (blocks 856 and 860). This code corresponds to an index of 0 (e.g., XORing code 0 with the last index which is also 0), which is the escape code in the "" context (blocks 862 and 866). The decoder knows it needs a literal, and pulls the "b" from the literals stream, leaving "rcd" (blocks 868 and 870). The output stream is now "ab", and the code stream is 0, 1, 1, 1, 0, 1, 1, 0, 0, 0, 0, as shown in FIG. 7C.

Figure 7D:
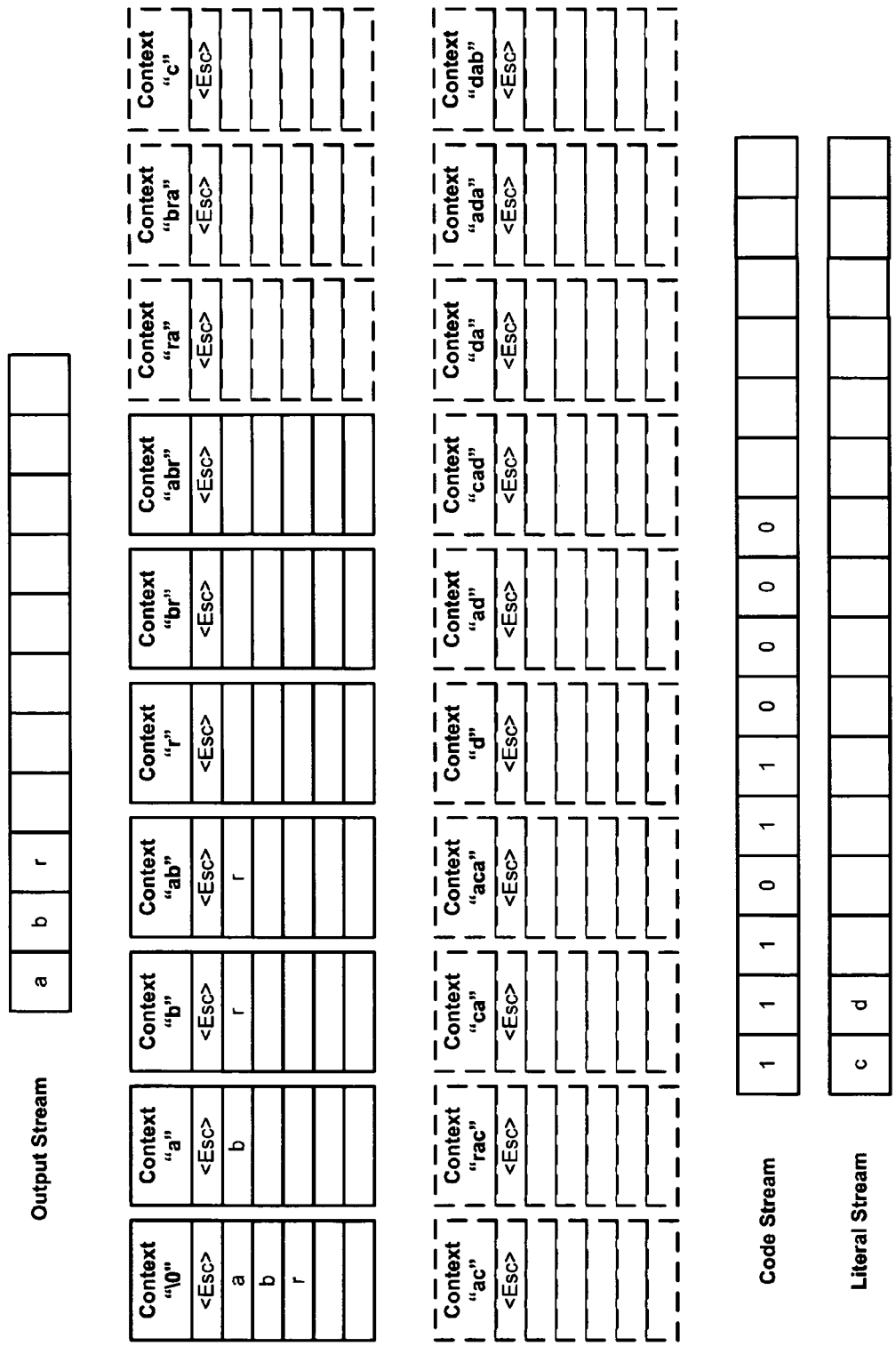

Note that the context tables are evolving the same way as they did in the coding example. This is a precondition for decoding to work—it has to maintain the same model as the encoder. Continuing, the decoder is in the "ab" context. Neither "ab" nor "b" context can code anything but an escape, so we implicitly escape back to the "" context, and retrieve the next code from the code stream (0, leaving 1, 1, 1, 0, 1, 1, 0, 0, 0, 0). This corresponds to an index of 0 (e.g., XORing code 0 with the last index value which is also 0), or escape. The decoder retrieves the next literal ("r") from the literal stream, and appends it to the output stream (which is now "abr") as shown in FIG. 7D.

Figure 7E:
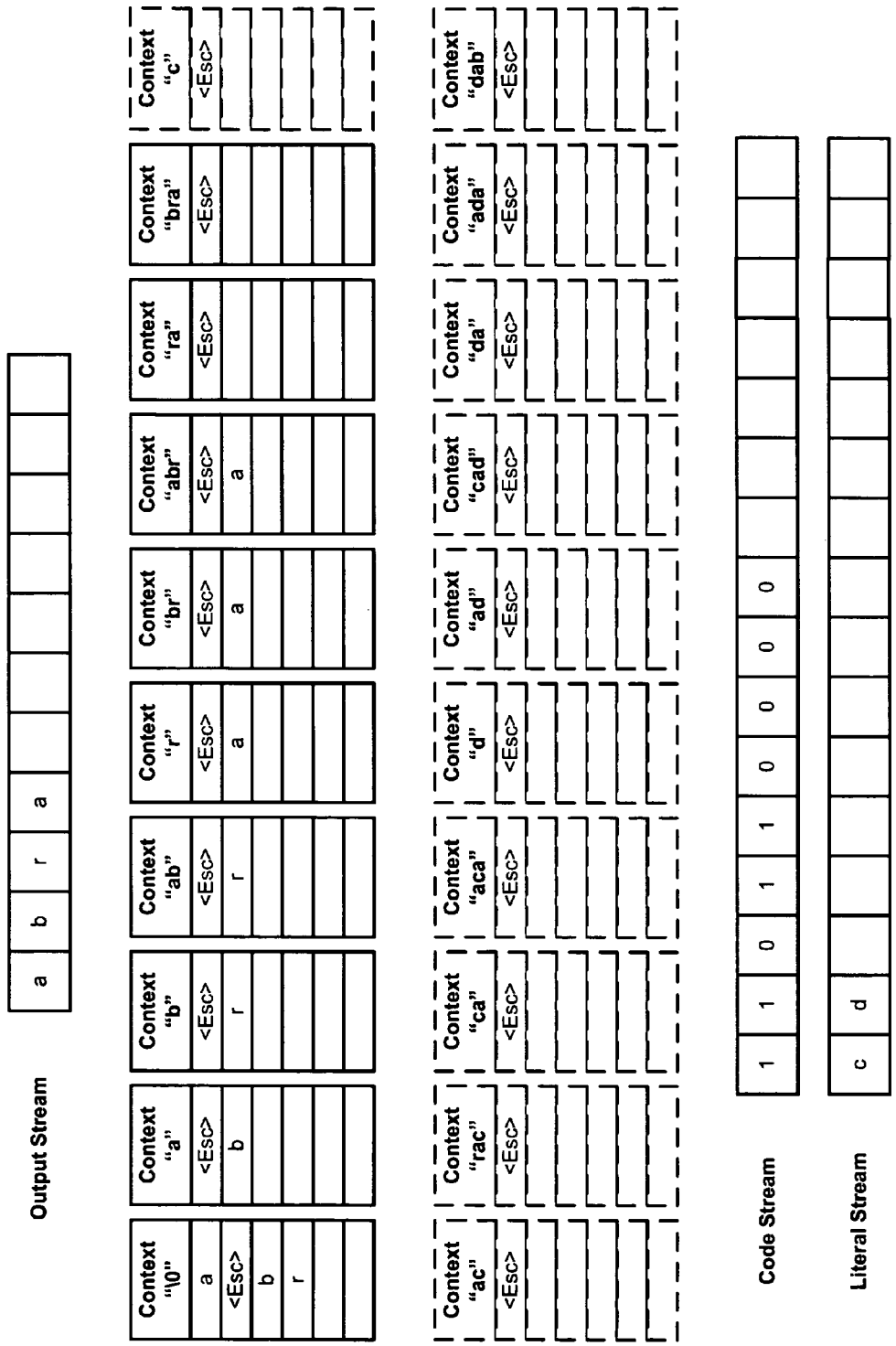

The decoder is now in the context "abr", which can only generate escapes (all the way back to "" context). The decoder takes the next code (1, leaving 1, 1, 0, 1, 1, 0, 0, 0, 0), which corresponds to an index of 1 (e.g., XORing code 1 with the last index of 0). Looking in the "" context table, we see that is the symbol "a". The output stream is now "abra", the code stream is 1, 1, 0, 1, 1, 0, 0, 0, 0, and the literals stream is still "cd". In addition, the context table "" is sorted so that "a" is now at index 0 entry as shown in FIG. 7E.

Figure 7F:
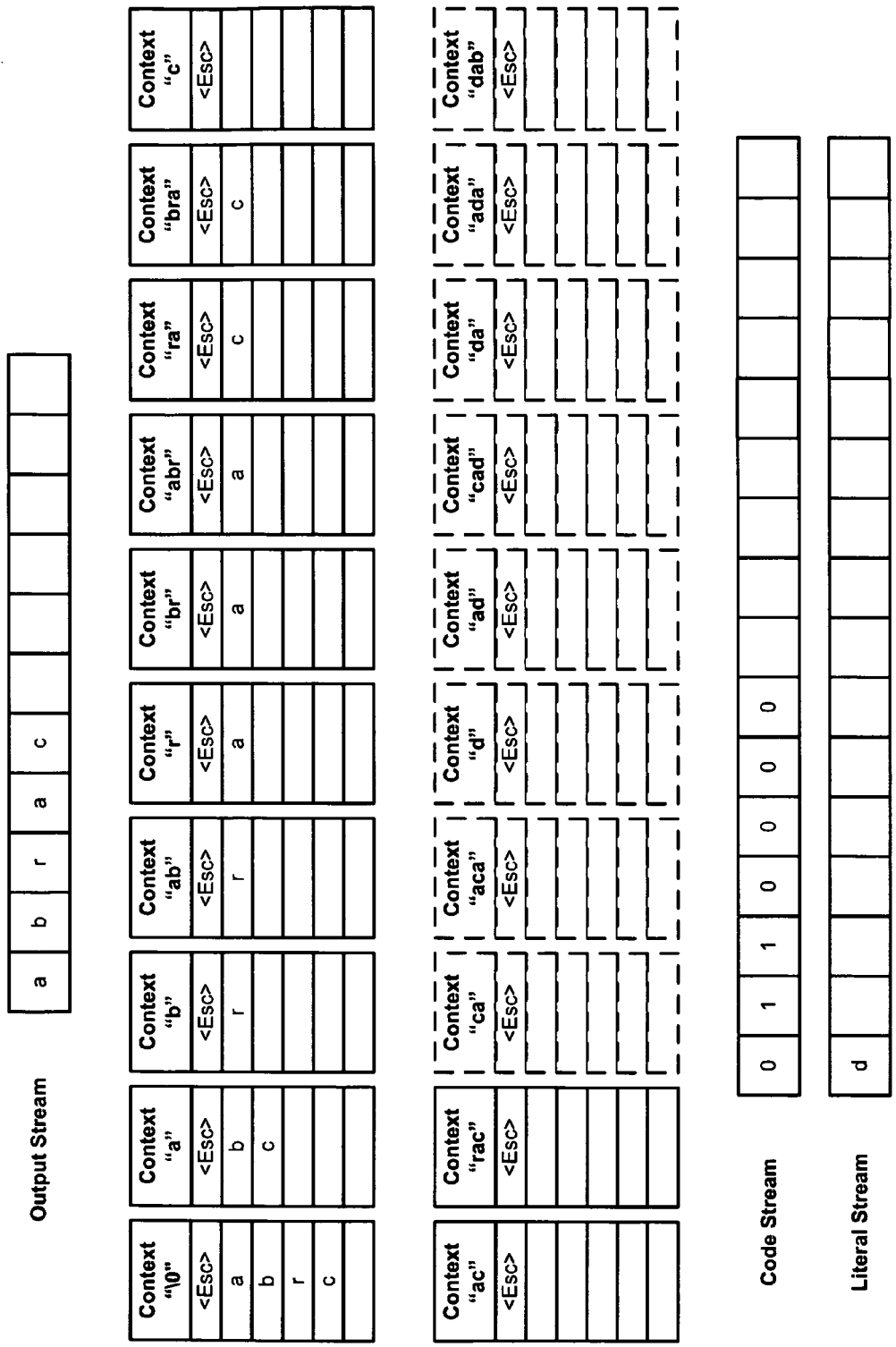

The decoder is now in the "bra" context, which generates implicit escapes back to the "a" context. Since "a" can generate something other than the escape code, we pull the next code from the code stream (1, leaving 1, 0, 1, 1, 0, 0, 0). The 1 code corresponds to an index value of 0 (e.g., 1 XOR the previous index of 1). Looking in the "a" context table, that's an escape to the "" context, which can generate something other than the escape code. The decoder then takes another code (1, leaving 0, 1, 1, 0, 0, 0, 0) from the code stream. The 1 code corresponds to a 1 index (e.g., 1 XOR the previous index of 0). Looking at the "" context table, it is an escape, so the decoder consumes the next literal ("c", leaving just "d") from the literals stream. The output is now "abrac", the literals stream contains just "d", and the code stream is 0, 1, 1, 0, 0, 0, 0. In addition, context "" is sorted to have the escape code moved up front at index 0 as shown in FIG. 7F.

Figure 7G:
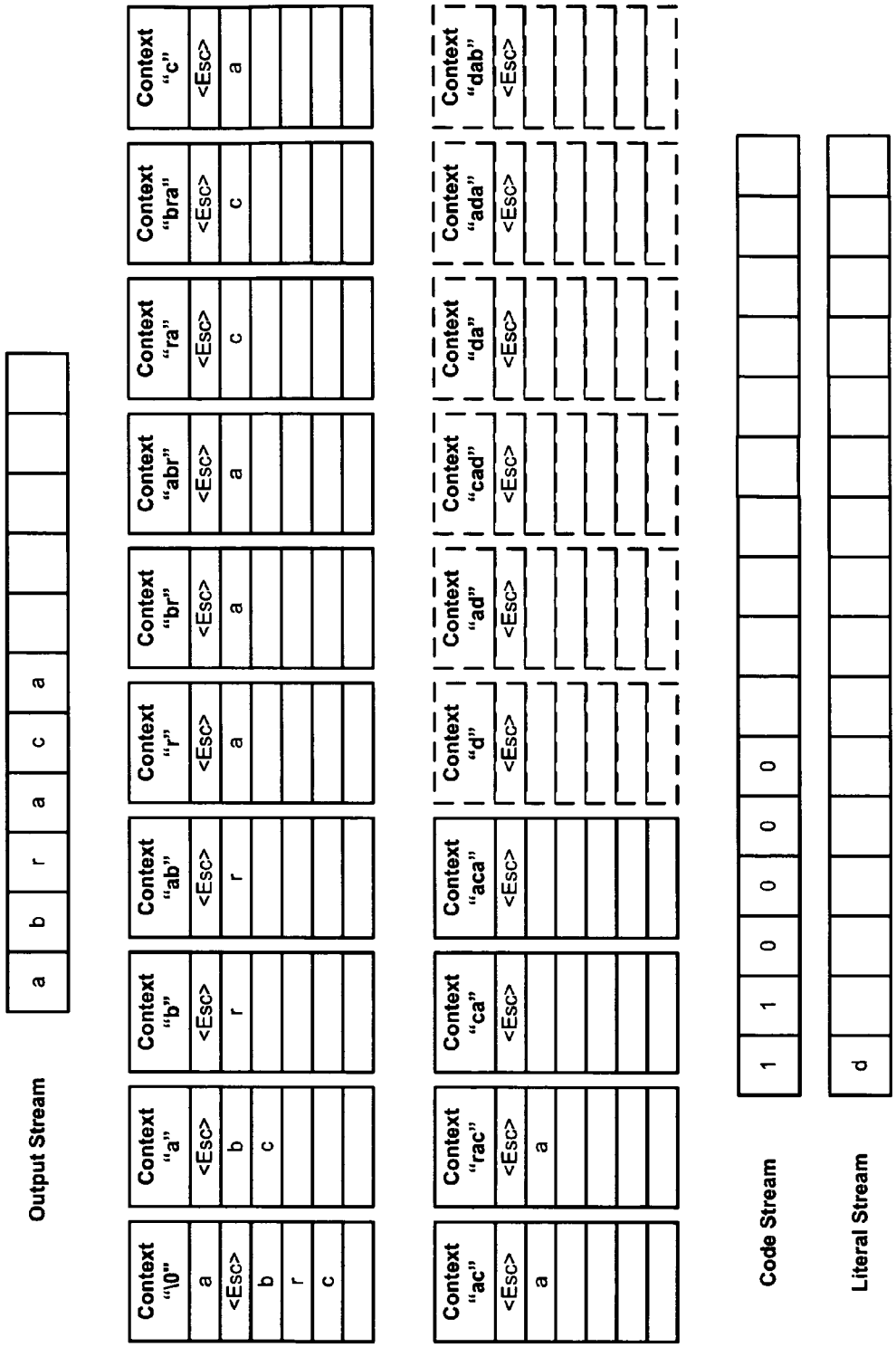

The decoder is now in the "rac" context, which escapes back to the "" context. In the "" context, since it can generate something other than the escape code, the decoder consumes a code value (0, leaving 1, 1, 0, 0, 0, 0). This corresponds to an index value of 1 (e.g., 0 XOR previous index of 1). This corresponds to the letter "a" in context "". The output is now "abraca", the literals stream is "d", and the remaining code stream is 1, 1, 0, 0, 0, 0. In addition, context "" is sorted to have "a" moved up front at index 0, as shown in FIG. 7G.

Figure 7H:
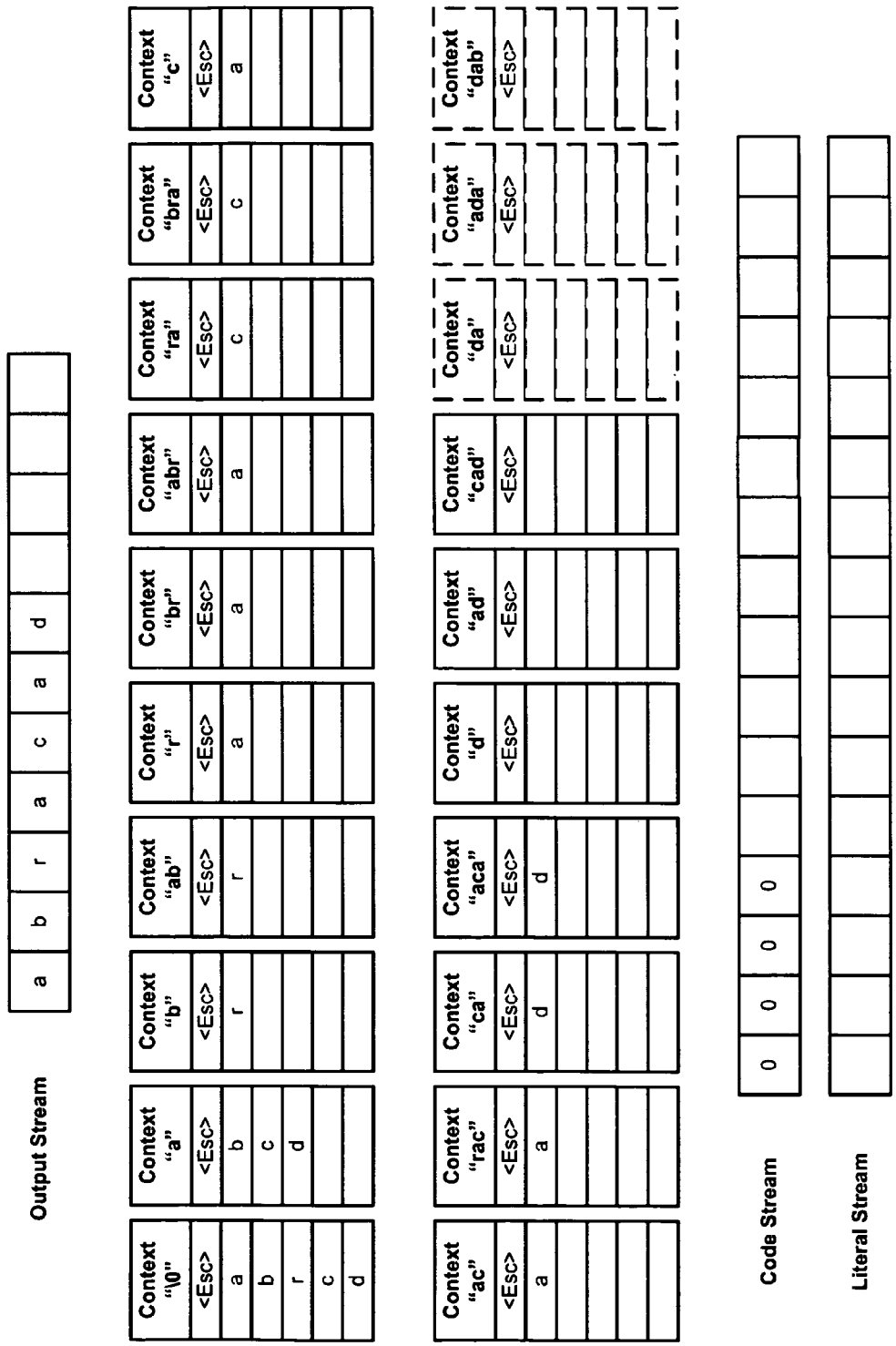
Figure 71:
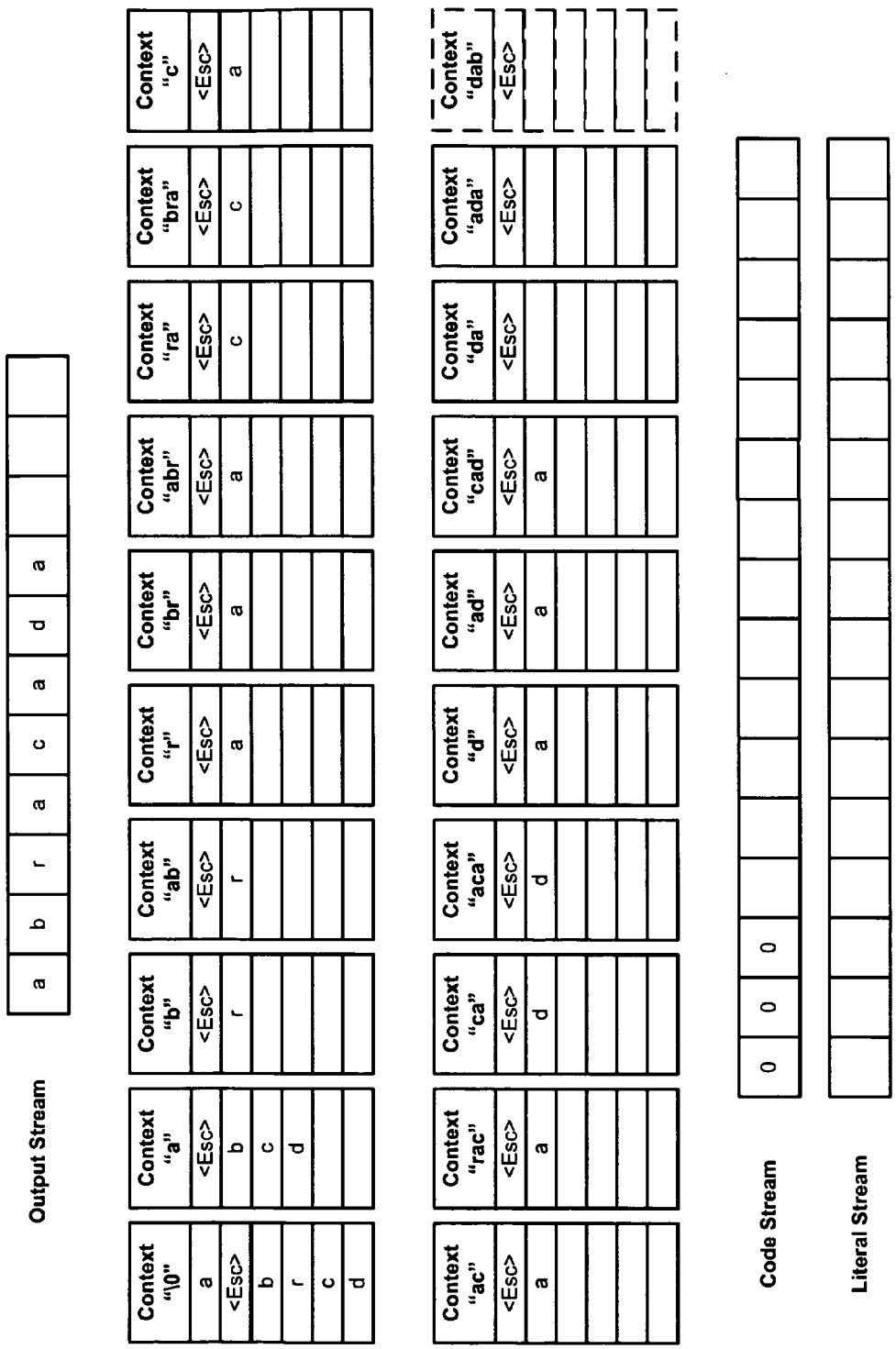

The decoder is now in the "aca" context, which escapes back to the "a" context. In the "a" context, since it can generate something other than the escape code, the decoder consumes a code value (1, leaving 1, 0, 0, 0, 0). This code value corresponds to an index value of 0 (1 XOR previous index of 1). At index 0 in the "a" context, there is an escape. The decoder escapes to the "" context and since context "" can generate something other than the escape code, the decoder consumes another code (1, leaving 0, 0, 0, 0). The code 1 corresponds to an index value of 1 (1 XOR previous index of 0). This is an escape. The decoder consumes the last literal from the literals stream. The output is now "abracad", the literals stream is "", and the remaining code stream is 0, 0, 0, 0. In addition, context table "" is sorted to have the escape code moved up front at index 0, as shown in FIG. 7H.

The decoder is now in the "cad" context, which escapes back to the "" context be cause it can only generate the escape code. The decoder consumes a code value (0, leaving 0, 0, 0). This corresponds to an index value of 1 (0 XOR previous index of 1). At index 1 in the "" context is the letter "a". The "a" is then put into the output stream and the output is now "abracada", the literals stream is "", and the remaining code stream is 0, 0, 0. In addition, context "" table is sorted to move "a" up front at index 0, as shown in FIG. 7I.

Figure 7J:
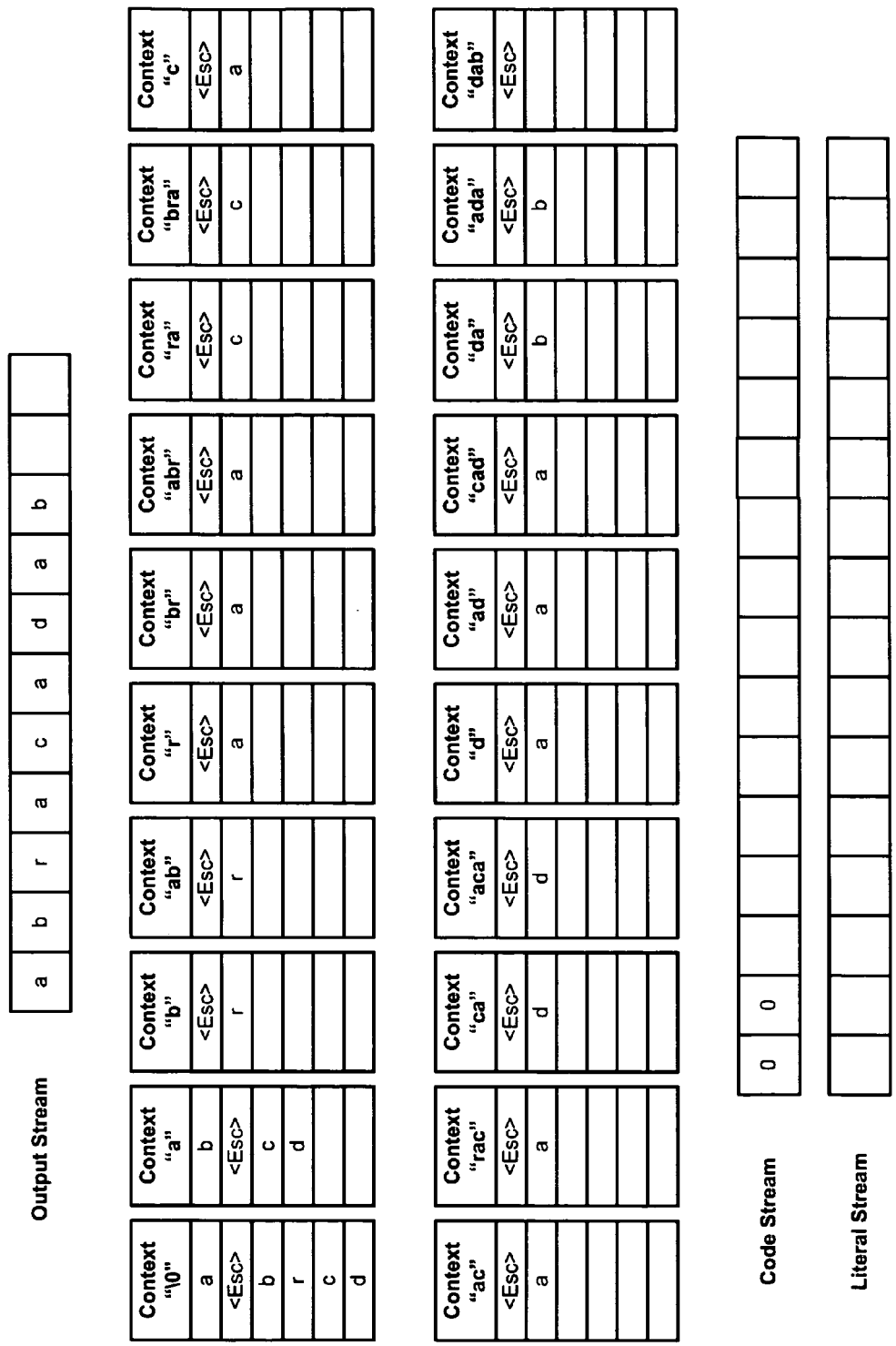

The decoder is in the "ada" context, which escapes back to the "a" context (see FIG. 4). Since "a" context can generate something other than the escape code, the decoder consumes a code value (0, leaving 0, 0) from the code stream. This corresponds to an index value of 1 (0 XOR previous index of 1). At index 1 in the "a" context is the letter "b" and "b" will be put in the output stream. The output is now "abracadab", the literals stream is "", and the remaining code stream is 0, 0. In addition, context "a" table is sorted to move "b" up front at index 0, as shown in FIG. 7J.

Figure 7K:
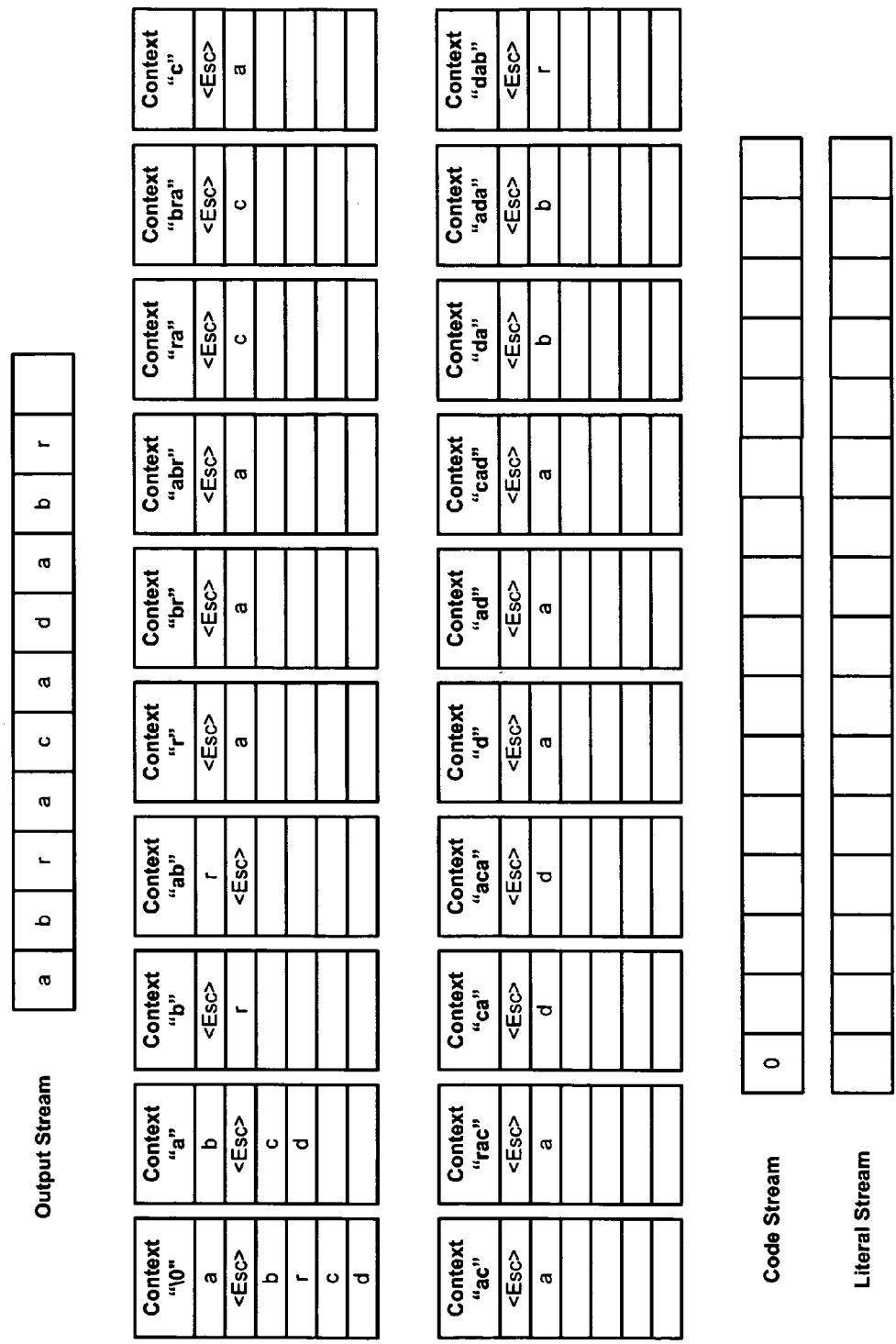
Figure 7L:
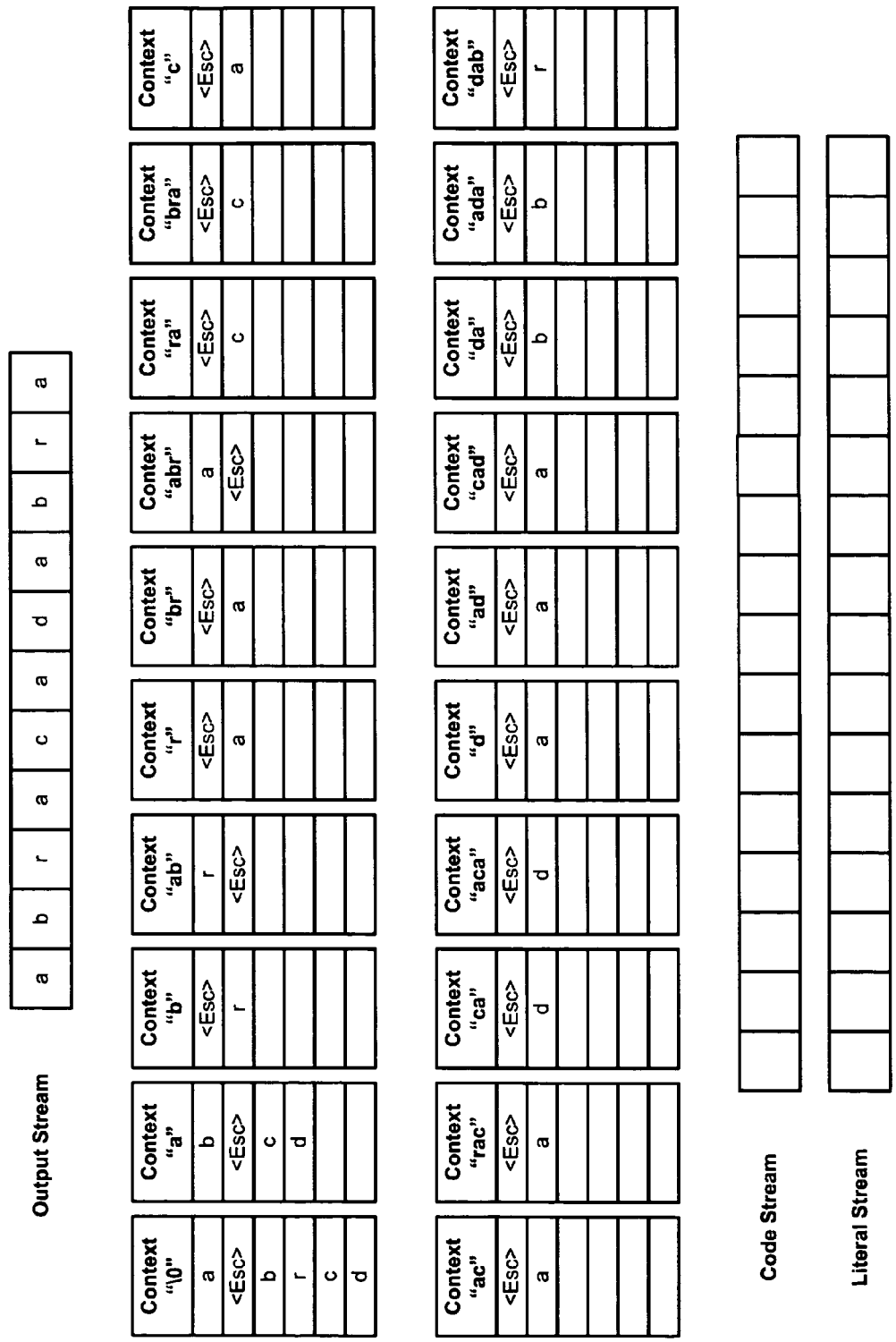

The decoder is now in the "dab" context, which escapes back to the "ab" context. Since "ab" context can generate something other than the escape code, the decoder consumes a code value (0, leaving 0) from the code stream. This corresponds to an index value of 1 (0 XOR previous index of 1). At index 1 in the "ab" context is the letter "r" which is put into the output stream. The output is now "abracadabr", the literals stream is "", and the remaining code stream is 0. In addition, context "ab" table is sorted to move "r" up front at index 0, as shown in FIG. 7K.

The decoder is now in the "abr" context. Since the "abr" context can generate something other than the escape code, the decoder consumes the last code value (0) from the code stream. This corresponds to an index value of 1 (0 XOR previous index of 1). At index 1 in the "abr" context is the letter "a" which will be added to the output stream. The output is now "abracadabra". In addition, the "abr" context table is sorted to move "a" up front at index 0. However, since we have no more codes (and we'd already consumed all of the literals), the process is done (block 858).

The process flows as shown in FIGS. 6A-6L and 7A-7L are similar to those as shown in FIGS. 1 and 5 with some modifications. For example, referring to FIG. 1, when an encoder emits a code to a code stream at block 145, an index of the corresponding symbol being coded is XORed with a previous index in order to generate a result to be stored in the code stream. In addition, the corresponding context table is sorted to move the entry corresponding to the symbol being coded up front at index 0. Similarly, during a decoding process as shown in FIG. 5, when a decoder consumes a code from the code stream at block 590, the code retrieved from the code stream is XORed with a previous index which generates a new index. Then a symbol corresponding to the new index that is other than an escape symbol is output to the output stream. If the new index points to an escape code in the current context table, then the decoder escapes from the current table to its parent context table. If the escaped to parent context table is a root context table, then a literal is consumed from the literal stream.

Figure 9I:
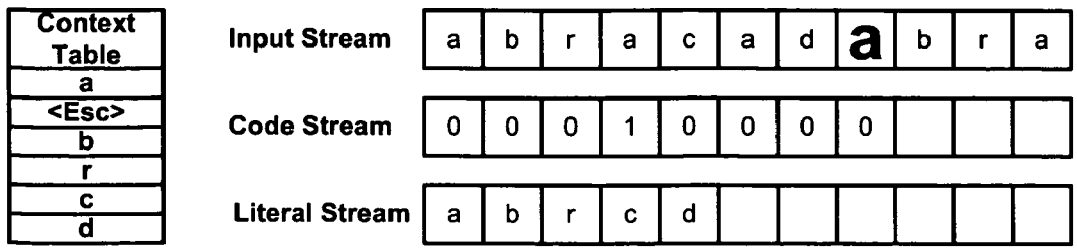

In the example illustrated above, multiple contexts or context tables are utilized. According to an alternative embodiment, a single table (e.g., order zero table) may be utilized, as shown in FIGS. 9A-9L and 10A-10L. Referring to FIGS. 9A-9L, the encoder starts with an empty context table at the root as shown in FIG. 9A, which no symbol has been coded. Next symbol "a" is retrieved. Since the context table can only code escape code, an index of the escape code is emitted into the code stream and the symbol is emitted into the literal stream. In addition, the table is updated by adding "a", as shown in FIG. 9B.

Similarly, for next symbols "b" and "r", the table cannot code these two symbols. As a result, two escape codes are emitted to the code stream and symbols "b" and "r" are emitted to literal stream. The table is then updated by adding "b" and "r", as shown in FIGS. 9C-9D.

Next symbol from the input stream is "a" again. Since the table now can encode "a", the index of "a" in the table is XORed with a previous index which is 0, generating a resulted code of 1. Thus, the code of 1 is emitted to the code stream, but no symbol is emitted to the literal stream. The table then is updated by moving "a" up front at index 0 as shown in FIG. 9E.

The next symbol from the input stream is "c". Since the table can encode something other than an escape but cannot encode "c", the index corresponding to the escape code (e.g., 1) is XORed with a previous index (e.g., 1), which generates a resulted code of 0. The code of 0 is then emitted to the code stream. In addition, symbol "c" is emitted to the literal stream and the table is updated by adding "c" and moving the escape code up front at index 0 as shown in FIG. 9F.

The next symbol from the input stream is "a" again. Since the table can encode "a", the index of "a" in the table (e.g., 1) is XORed with a previous index which is 1, generating a resulted code of 0. Thus, the code of 0 is emitted to the code stream, but no symbol is emitted to the literal stream. The table then is updated by moving "a" up front at index 0 as shown in FIG. 9G.

The next symbol from the input stream is "d", in which the table cannot encode it. As a result, the escape code is emitted (code of 0=escape index 1 XOR previous index of 1) in the code stream; "d" is added in the table; and the table is sorted to move the escape code up front at index 0 as shown in FIG. 9H.

The next symbol from the input stream is "a" again, in which the table can in fact encode it. As result, a code of 0 (e.g., code="a" index of 1 XOR previous index of 1) is emitted into the code stream. In addition, the table is sorted to move "a" up front at index 0 as shown in FIG. 9I.

Figure 9J:
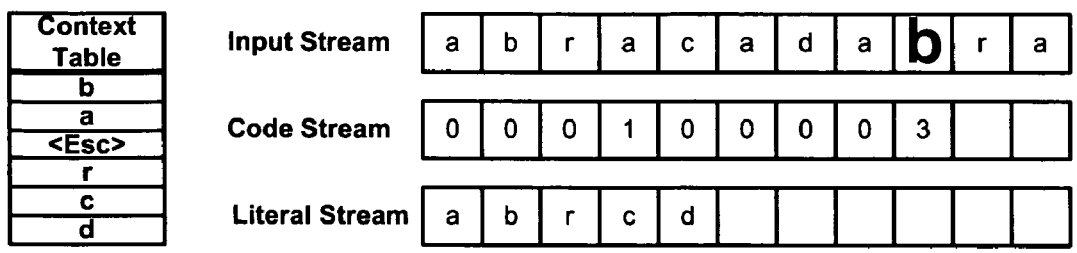

The next symbol from the input stream is "b" again, in which the table can in fact encode it. As a result, a code of 3 (e.g., code="b" index of 2 XOR previous index of 1) is emitted into the code stream. In addition, the table is updated to move "b" up front at index 0 as shown in FIG. 9J.

Figure 9K:
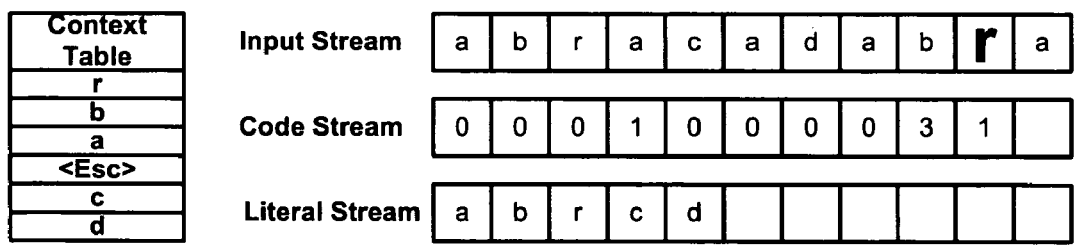

The next symbol from the input stream is "r" again, in which the table now can encode it. As a result, a code of 1 (e.g., code="r" index of 3 XOR the previous index of 2) is emitted into the code stream. In addition, the table is updated to move "r" up front at index 0 as shown in FIG. 9K.

Figure 9L:
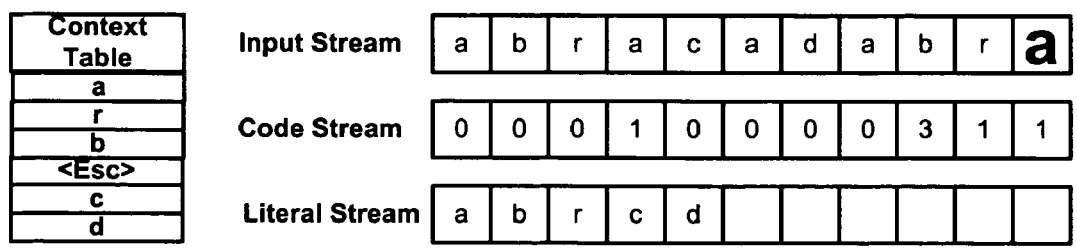
Figure 10A:
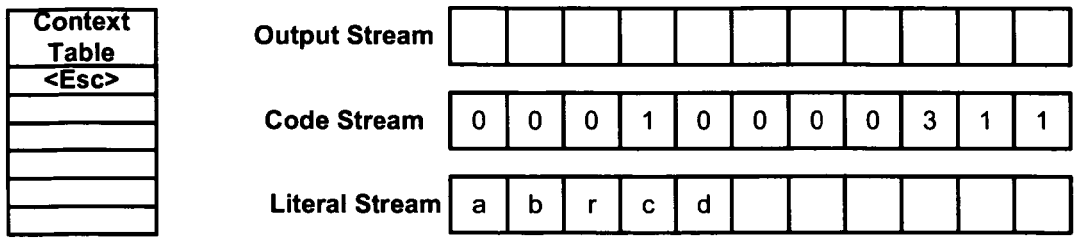
Figure 10B:
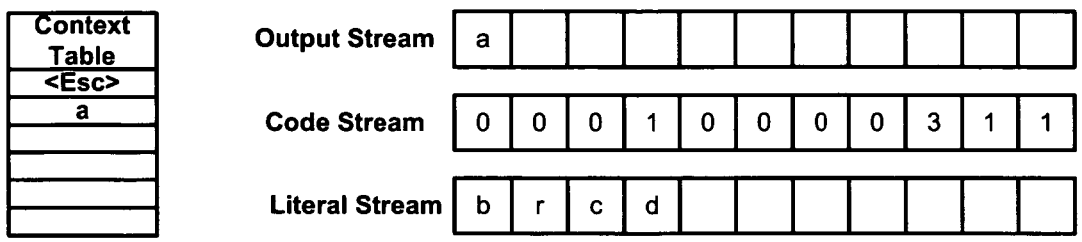
Figure 10C:
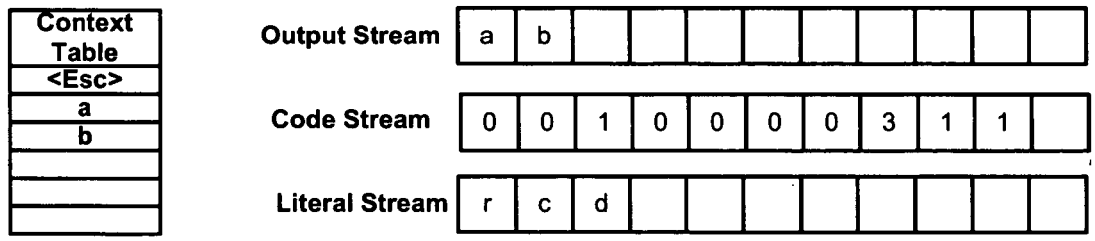
Figure 10D:
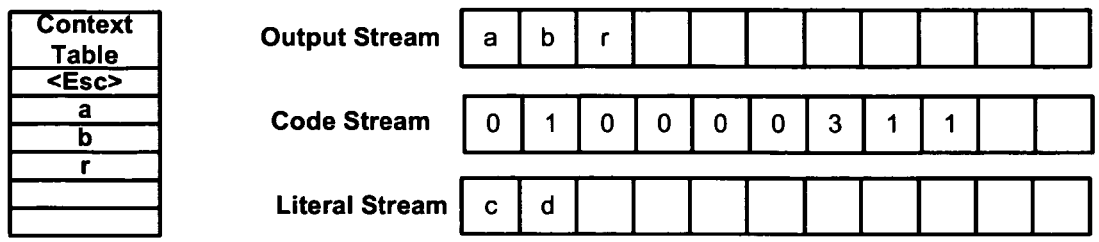

The final symbol from the input stream is "a", in which the table can encode it. As a result, a code of 1 (e.g., code="a" index of 2 XOR the previous index of 3) is emitted into the code stream. In addition, the table is updated to move "a" up front at index 0 as shown in FIG. 9L.

Figure 8A:
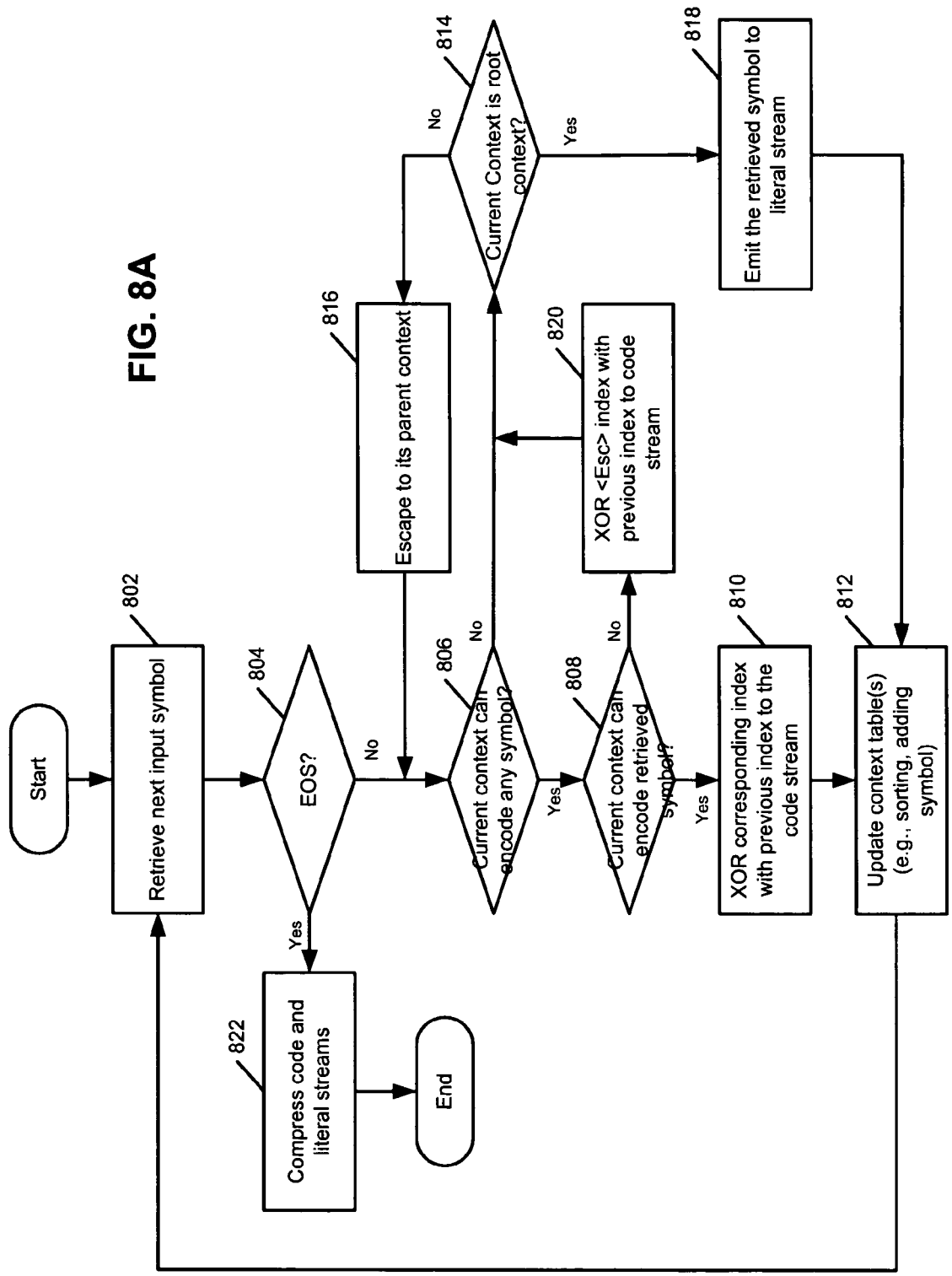
FIGS. 8A-8B are flow diagrams illustrating examples of encoding and decoding processes according to certain embodiments of the invention.
Figure 8B:
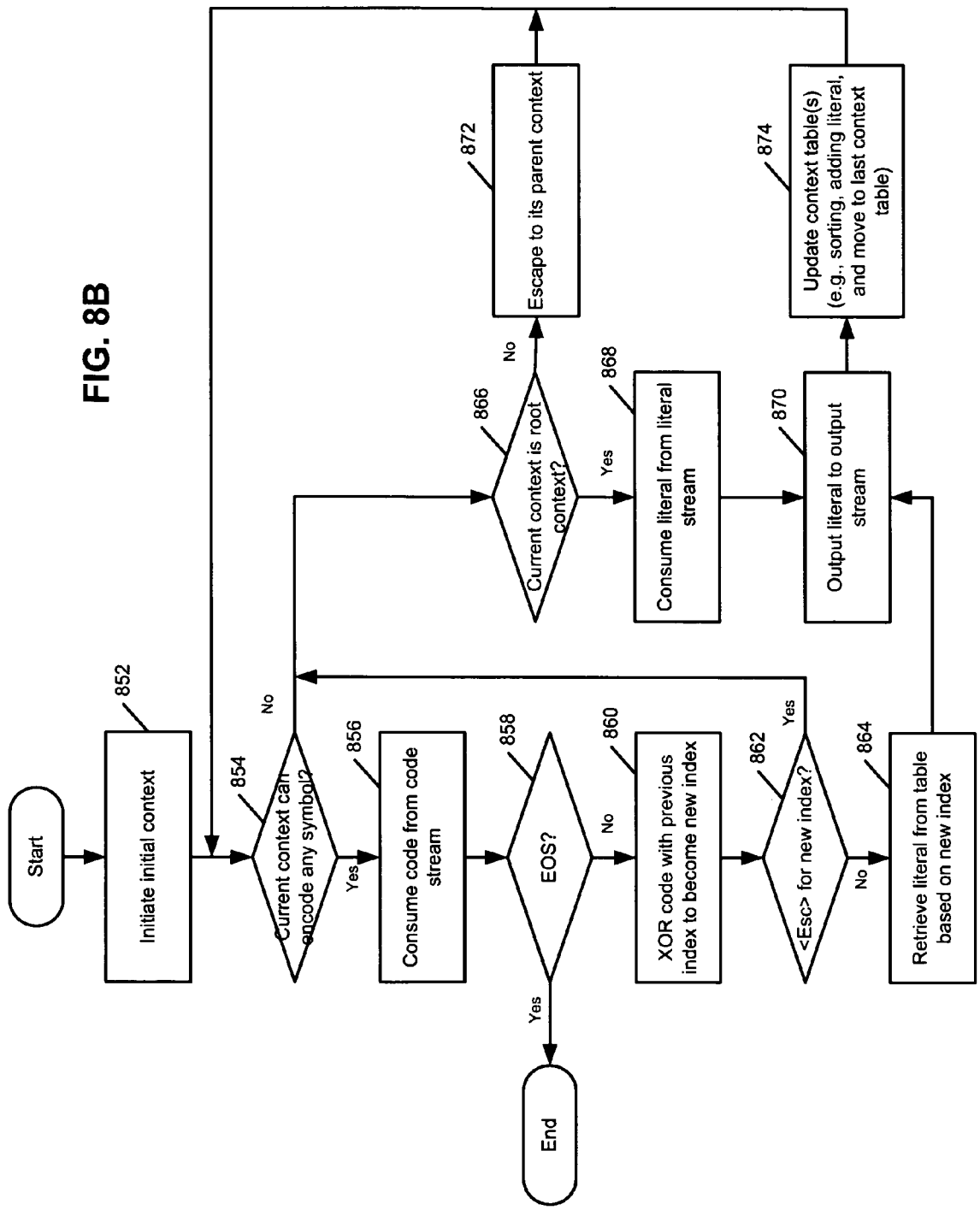

The operational flow for the encoding process is similar to those shown in FIG. 8A. The operational flow for the decoding process is similar to those shown in FIG. 8B.

Figure 11:
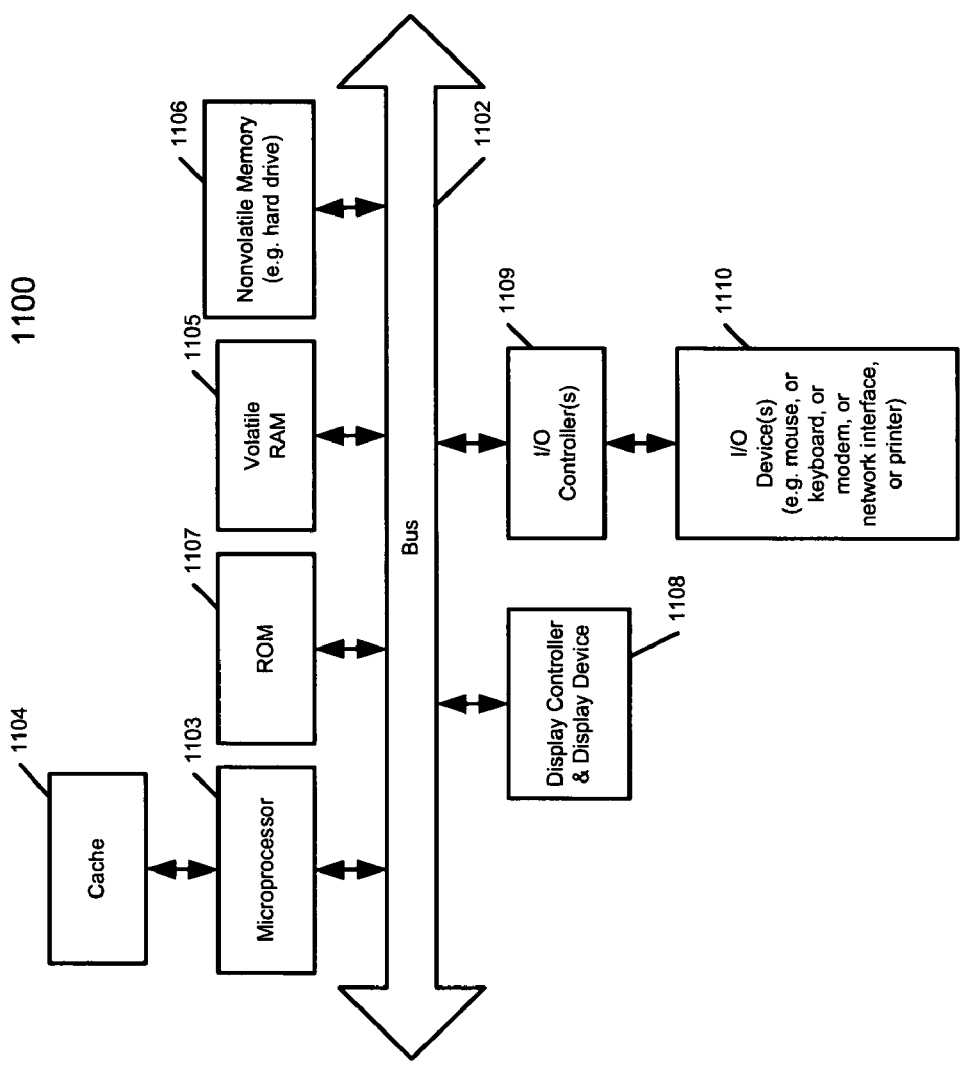
FIG. 11 is a block diagram illustrating an example of a data process system which may be used with one embodiment of the invention.

FIG. 11 illustrates a diagrammatic representation of a machine in the exemplary form of a computer system within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. For example, the system 1300 may be used as part of system, either an coder or a decoder, to perform the coding processes set forth above.

As shown in FIG. 11, the system 1100, which is a form of a data processing system, includes a bus or interconnect 1102 which is coupled to one or more microprocessors 1103 and a ROM 1107, a volatile RAM 1105, and a non-volatile memory 1106. The microprocessor 1103 is coupled to cache memory 1104 as shown in the example of FIG. 11. Processor 1103 may be, for example, a PowerPC microprocessor or an Intel compatible processor. Alternatively, processor 1103 may be a digital signal processor or processing unit of any type of architecture, such as an ASIC (Application-Specific Integrated Circuit), a CISC (Complex Instruction Set Computing), RISC (Reduced Instruction Set Computing), VLIW (Very Long Instruction Word), or hybrid architecture, although any appropriate processor may be used.

The bus 1102 interconnects these various components together and also interconnects these components 1103, 1107, 1105, and 1106 to a display controller and display device 1108, as well as to input/output (I/O) devices 1110, which may be mice, keyboards, modems, network interfaces, printers, and other devices which are well-known in the art.

Typically, the input/output devices 1110 are coupled to the system through input/output controllers 1109. The volatile RAM 1105 is typically implemented as dynamic RAM (DRAM) which requires power continuously in order to refresh or maintain the data in the memory. The non-volatile memory 1106 is typically a magnetic hard drive, a magnetic optical drive, an optical drive, or a DVD RAM or other type of memory system which maintains data even after power is removed from the system. Typically, the non-volatile memory will also be a random access memory, although this is not required.

While FIG. 11 shows that the non-volatile memory is a local device coupled directly to the rest of the components in the data processing system, embodiments of the present invention may utilize a non-volatile memory which is remote from the system; such as, a network storage device which is coupled to the data processing system through a network interface such as a modem or Ethernet interface. The bus 1102 may include one or more buses connected to each other through various bridges, controllers, and/or adapters, as is well-known in the art. In one embodiment, the I/O controller 1109 includes a USB (Universal Serial Bus) adapter for controlling USB peripherals. Alternatively, I/O controller 1109 may include an IEEE-1194 adapter, also known as FireWire adapter, for controlling FireWire devices.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present invention also relate to an apparatus for performing the operations herein. This apparatus may be specially constructed for the required purposes, or it may comprise a general-purpose computer selectively activated or reconfigured by a computer program stored in the computer. Such a computer program may be stored in a computer readable medium. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., carrier waves, infrared signals, digital signals, etc.)), etc.

The algorithms and displays presented herein are not inherently related to any particular computer or other apparatus. Various general-purpose systems may be used with programs in accordance with the teachings herein, or it may prove convenient to construct more specialized apparatus to perform the required method operations. The required structure for a variety of these systems will appear from the description below. In addition, embodiments of the present invention are not described with reference to any particular programming language. It will be appreciated that a variety of programming languages may be used to implement the teachings of embodiments of the invention as described herein.

In the foregoing specification, embodiments of the invention have been described with reference to specific exemplary embodiments thereof. It will be evident that various modifications may be made thereto without departing from the broader spirit and scope of embodiments of the invention as set forth in the following claims. The specification and drawings are, accordingly, to be regarded in an illustrative sense rather than a restrictive sense.

What is claimed is:

1. A computer implemented method for encoding data, the method comprising:

in response to a symbol retrieved from an input stream having a sequence of symbols, determining whether a current context can encode the retrieved symbol;

emitting a code representing an escape token to a code stream if the current context cannot encode the retrieved symbol;

escaping from the current context to a preceding context of the current context if the current context is not a root context;

emitting the retrieved symbol to a literal stream if the current context is a root context, wherein the code stream and the literal stream are to be compressed and encoded by a compressor;

emitting a code representing the retrieved symbol to the code stream if the current context can encode the retrieved symbol, wherein the code representing the retrieved symbol is generated based on an index associated with the retrieved symbol stored within the current context; and sorting at least a portion of the current context based on the emitted code and/or the emitted symbol.

2. The method of claim 1, further comprising:

generating the code representing the escape token by performing an exclusive OR (XOR) operation between an index of the escape token stored in the current context and an immediately previous used index; and sorting the current context by moving an entry associated with the escape token up front at index zero.

3. The method of claim 1, further comprising:

adding the retrieved symbol in the current context if the current context cannot encode the retrieved symbol; and creating one or more child contexts from the current context, wherein each child context includes a parent pointer pointing to a context corresponding to previous encoded one or more symbols in sequence while the current context includes one or more child pointers pointing to the one or more child contexts respectively.

4. The method of claim 1, further comprising:

performing an exclusive OR (XOR) operation between an index corresponding to the retrieved symbol stored in the current context and an immediately previous used index; and sorting the current context including moving an entry associated with the retrieved symbol up front at index zero.

5. The method of claim 1, further comprising:

prior to determining whether a current context can encode the retrieved symbol, determining whether the current context can encode anything other than an escape token; and escaping from the current context to the parent context of the current context without emitting a code representing an escape token, if the current context cannot encode anything other than an escape token.

6. A computer readable medium including instructions that, when executed by a processing system, cause the processing system to perform a method for encoding data, the method comprising:

in response to a symbol retrieved from an input stream having a sequence of symbols, determining whether a current context can encode the retrieved symbol;

emitting a code representing an escape token to a code stream if the current context cannot encode the retrieved symbol;

escaping from the current context to a preceding context of the current context if the current context is not a root context;

emitting the retrieved symbol to a literal stream if the current context is a root context, wherein the code stream and the literal stream are to be compressed and decoded by a decoder;

emitting a code representing the retrieved symbol to the code stream if the current context can encode the retrieved symbol, wherein the code representing the retrieved symbol is generated based on an index associated with the retrieved symbol stored within the current context; and sorting at least a portion of the current context based on the emitted code and/or the emitted symbol.

7. The computer readable medium of claim 6, wherein the method further comprises:

generating the code representing the escape token by performing an exclusive OR (XOR) operation between an index of the escape token stored in the current context and an immediately previous used index; and sorting the current context by moving an entry associated with the escape token up front at index zero.

8. The computer readable medium of claim 6, wherein the method further comprises:

adding the retrieved symbol in the current context if the current context cannot encode the retrieved symbol; and creating one or more child contexts from the current context, wherein each child context includes a parent pointer pointing to a context corresponding to previous encoded one or more symbols in sequence while the current context includes one or more child pointers pointing to the one or more child contexts respectively.

9. The computer readable medium of claim 6, wherein the method further comprises:

performing an exclusive OR (XOR) operation between an index corresponding to the retrieved symbol stored in the current context and an immediately previous used index; and sorting the current context including moving an entry associated with the retrieved symbol up front at index zero.

10. The computer readable medium of claim 6, wherein the method further comprises:

prior to determining whether a current context can encode the retrieved symbol, determining whether the current context can encode anything other than an escape token; and escaping from the current context to the parent context of the current context without emitting a code representing an escape token, if the current context cannot encode anything other than an escape token.

11. A computer implemented method for decoding data, the method comprising:

in response to a code stream having a plurality codes and a literal stream having a plurality of symbols encoded by an encoder, consuming a code from the code stream if the current context can code any symbol other than an escape token;

generating an index value based on the consumed code, including performing a predetermined mathematical operation with the consumed code;

retrieving a symbol from an entry corresponding to the index value stored in a table of the current context;

emitting the symbol to an output stream; and sorting the table by moving the entry corresponding to the emitted symbol up front at index zero.

12. The method of claim 11, further comprising escaping from the current context to a parent of the current context if the current context is not a root context and if the retrieved symbol from the entry corresponding to the index value is an escape token.

13. The method of claim 12, further comprising:

consuming a literal from the literal stream if the current context is a root context;

emitting the consumed literal to the output stream; and updating the current context including moving an entry corresponding to the escape token up front at index zero.

14. The method of claim 11, wherein performing a predetermined mathematical operation with the consumed code comprises performing an exclusive OR (XOR) the consumed code with a previously used index to generate the index value.

15. The method of claim 11, further comprising:
   escaping from the current context to a parent context of the current context if the current context is not a root context and if the current context cannot code anything other than an escape token;
   consuming a literal from the literal stream if the current context is a root context; and
   emitting the consumed literal to the output stream.

16. A computer readable medium including instructions that, when executed by a processing system, cause the processing system to perform a method for decoding data, the method comprising:
   in response to a code stream having a plurality codes and a literal stream having a plurality of symbols encoded by an encoder, consuming a code from the code stream if the current context can code any symbol other than an escape token;
   generating an index value based on the consumed code, including performing a predetermined mathematical operation with the consumed code;
   retrieving a symbol from an entry corresponding to the index value stored in a table of the current context;
   emitting the symbol to an output stream; and
   sorting the table by moving the entry corresponding to the emitted symbol up front at index zero.

17. The computer readable medium of claim 16, wherein the method further comprises escaping from the current context to a parent of the current context if the current context is not a root context and if the retrieved symbol from the entry corresponding to the index value is an escape token.

18. The computer readable medium of claim 17, wherein the method further comprises:
   consuming a literal from the literal stream if the current context is a root context;
   emitting the consumed literal to the output stream; and
   updating the current context including moving an entry corresponding to the escape token up front at index zero.

19. The computer readable medium of claim 16, wherein performing a predetermined mathematical operation with the consumed code comprises performing an exclusive OR (XOR) the consumed code with a previously used index to generate the index value.

20. The computer readable medium of claim 16, wherein the method further comprises:
   escaping from the current context to a parent context of the current context if the current context is not a root context and if the current context cannot code anything other than an escape token;
   consuming a literal from the literal stream if the current context is a root context; and
   emitting the consumed literal to the output stream.

* * * * *